United States Patent
Lee et al.

(10) Patent No.: US 8,081,516 B2
(45) Date of Patent: Dec. 20, 2011

(54) METHOD AND APPARATUS TO SUPPRESS FRINGING FIELD INTERFERENCE OF CHARGE TRAPPING NAND MEMORY

(75) Inventors: Hang-Ting Lee, Hsinchu (TW); Yi-Hsuan Hsiao, Chiayi County (TW)

(73) Assignee: Macronix International Co., Ltd., Hsinchu (TW)

( * ) Notice: Subject to any disclaimer, the term of this patent is extended or adjusted under 35 U.S.C. 154(b) by 186 days.

(21) Appl. No.: 12/540,260

(22) Filed: Aug. 12, 2009

(65) Prior Publication Data
US 2010/0172183 A1     Jul. 8, 2010

Related U.S. Application Data

(60) Provisional application No. 61/142,324, filed on Jan. 2, 2009.

(51) Int. Cl.
*G11C 16/04*     (2006.01)
(52) U.S. Cl. .......................... 365/185.18; 365/185.17
(58) Field of Classification Search ............. 365/185.18, 365/185.17
See application file for complete search history.

(56) References Cited

U.S. PATENT DOCUMENTS

| | | | |
|---|---|---|---|
| 4,217,601 A | 8/1980 | DeKeersmaecker et al. |
| RE31,083 E | 11/1982 | DeKeersmaecker et al. |
| 4,630,086 A | 12/1986 | Sato et al. |
| 5,286,994 A | 2/1994 | Ozawa et al. |
| 5,319,229 A | 6/1994 | Shimoji et al. |
| 5,952,692 A | 9/1999 | Nakazato et al. |
| 6,011,725 A | 1/2000 | Eitan |
| 6,026,026 A | 2/2000 | Chan et al. |
| 6,074,917 A | 6/2000 | Chang et al. |
| 6,169,693 B1 | 1/2001 | Chan et al. |
| 6,218,700 B1 | 4/2001 | Papadas et al. |
| 6,469,343 B1 | 10/2002 | Miura et al. |
| 6,512,696 B1 | 1/2003 | Fan et al. |
| 6,605,840 B1 | 8/2003 | Wu et al. |
| 6,709,928 B1 | 3/2004 | Jenne et al. |

(Continued)

FOREIGN PATENT DOCUMENTS

EP     0016246     10/1980

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner* — Huan Hoang
(74) *Attorney, Agent, or Firm* — Kenta Suzue; Haynes Beffel & Wolfeld LLP

(57) ABSTRACT

With advanced lithographic nodes featuring a half-pitch of 30 nm or less, charge trapping NAND memory has neighboring cells sufficiently close together that fringing fields from a neighboring pass gate interferes with the threshold voltage. The interference results from fringing fields that occupy the gaps that separate the neighboring charge storage structures. The fringing electric fields are suppressed, by the insulating structures having a relative dielectric constant with respect to vacuum that is less than a relative dielectric constant of silicon oxide, from entering the neighboring charge storage structures. In some embodiments, the insulating structures suppress the fringing electric fields from entering a channel region. This suppresses the short channel effects despite the small dimensions of the devices.

24 Claims, 19 Drawing Sheets

U.S. PATENT DOCUMENTS

| | | | |
|---|---|---|---|
| 6,720,630 | B2 | 4/2004 | Mandelman et al. |
| 6,740,928 | B2 | 5/2004 | Yoshii et al. |
| 6,784,480 | B2 | 8/2004 | Bhattacharyya |
| 6,815,764 | B2 | 11/2004 | Bae et al. |
| 6,818,558 | B1 | 11/2004 | Rathor et al. |
| 6,858,906 | B2 | 2/2005 | Lee et al. |
| 6,897,533 | B1 | 5/2005 | Yang et al. |
| 6,912,163 | B2 | 6/2005 | Zheng et al. |
| 6,977,201 | B2 | 12/2005 | Jung et al. |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih et al. |
| 7,187,590 | B2 | 3/2007 | Zous et al. |
| 7,473,589 | B2 | 1/2009 | Lai et al. |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0224564 | A1 | 12/2003 | Kang et al. |
| 2004/0079983 | A1 | 4/2004 | Chae et al. |
| 2004/0222528 | A1* | 11/2004 | Kunikiyo ............ 257/758 |
| 2004/0251489 | A1 | 12/2004 | Jeon et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0062098 | A1 | 3/2005 | Mahajani et al. |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0118858 | A1 | 6/2006 | Jeon et al. |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |
| 2007/0120179 | A1 | 5/2007 | Park et al. |
| 2007/0138539 | A1 | 6/2007 | Wu et al. |
| 2008/0099830 | A1 | 5/2008 | Lue et al. |
| 2008/0116506 | A1 | 5/2008 | Lue |
| 2008/0285344 | A1* | 11/2008 | Ruttkowski et al. ...... 365/185.05 |
| 2009/0039417 | A1 | 2/2009 | Chen et al. |
| 2009/0179244 | A1* | 7/2009 | Ono ............ 257/295 |

FOREIGN PATENT DOCUMENTS

| | | |
|---|---|---|
| EP | 1411555 | 4/2004 |
| EP | 01677311 | 7/2006 |
| EP | 01677312 | 7/2006 |
| JP | 11040682 A | 2/1999 |
| JP | 2004363329 | 12/2004 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM CELLS," IEEE Electron Device Letters, vol. 24, No. 4, Apr. 2003, 260-262.

DiMARIA, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications," 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Int'l Symp on VLSI Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lee, Chang, et al., "A Novel SONOS Structure of SiO2/SiN/Al2O3 with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22. 6.4.

Likharev, "Layered Tunnel Barriers for Nonvolatile Memory Devices,"Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38 (11) Nov. 1991 2519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 6 pages.

Search Report mailed Feb. 14, 2007 in European Application No. 06000093.2 (Pub. No. EP-01677312) filed on Jan. 3, 2006, 5 pages.

Search Report mailed Nov. 14, 2007 in European Application No. 06000064.3 (Pub. No. EP-01677312) filed on Jan. 3, 2006, 4 pages.

Search Report mailed 14 Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Tsai et al., "Novel SONOS-Type Nonvolatile Memory Device with Suitable Band Offset in HfAlO Charge-Trapping Layer," Int'l Symp. On VLSI Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch 2-Bit per Cell Flash Memory," IEDM Tech. Dig. 2002, 931-934.

Yi-Hsuan Hsiao et al. "A Study of Stored Charge Inteference and Fringing Field Effects in Sub-30nm Charge-Trapping NAND Flash," Memory Workshop, May 10-14, 2009, IMW '09 IEEE International, consisting of 2 pages.

Daewoong Kang et al. "Improving the Cell Characteristics Using Low-k Gate Spacer in 1Gb NAND Flash Memory," IEEE.

Andrew J. Hazelton et al. "Double-patterning Requirements for Optical Lithography and Prospects for Optical Extension Without Double Patterning," J. Micro/Nanolith, MEMS MOEMS 8(1), 011003 (Jan.-Mar. 2009), consisting of 11 pages.

Yi-Shiang Chang et al. "Pattern Decomposition and Process Integration of Self-Aligned Double Patterning for 30nm Node NAND FLASH Process and Beyond," Optical Microlithography, Proc. of SPIE, vol. 7274, 2009, consisting of 8 pages.

Huixiong Dai et al. "Implementing Self-Aligned Double Patterning on Non-Gridded Design Layouts," Design for Manufacturability through Design-Process Integration Proc. of SPIE vol. 7275 2009, consisting of 11 pages.

J.C. Yang et al. "The Impact of Interference on Multi-Level-Cell Applications in Scaled Nitride-Storage Flash Memory," Electron Devices Meeting, Dec. 11-13, 2006 IEDM pp. 1-4.

Y.W. Chang et al. "A New Interference Phenomenon in Sub-60nm Nitride-Based Flash Memory," IEEE 2007, pp. 81-82.

* cited by examiner

| Disturb Mode | Neighbor Programmed Cell |
|---|---|
| Fresh | N/A |
| WL | Cell_4 & 6 |
| BL | Cell_2 & 8 |
| Side | Cell_2 & 4 & 6 & 8 |
| Corner | Cell_1 & 3 & 7 & 9 |
| All | Cell_1 & 2 & 3 & 4 & 6 & 7 & 8 & 9 |
| 1 WL | Cell_4 |
| 1 BL | Cell_2 |

METHOD AND APPARATUS TO SUPPRESS FRINGING FIELD INTERFERENCE OF CHARGE TRAPPING NAND MEMORY

REFERENCE TO RELATED APPLICATION

The present application claims the benefit under 35 U.S.C. §119(e) of U.S. Provisional Application No. 61/142,324, filed on Jan. 2, 2009; the entire contents of which is incorporated herein by reference.

BACKGROUND

1. Field of the Invention

The present application relates to the field of nonvolatile NAND memory, and particularly to nonvolatile NAND memory having a 60 nm pitch or less.

2. Description of Related Art

With 90 nm design rule cells, a NAND nonvolatile memory storing charge on floating gates has the problem of parasitic capacitance between the floating gates of neighboring cells in the NAND nonvolatile memory. A solution to this problem of parasitic capacitance between neighboring floating gates, is the use of air spacers between the floating gates of neighboring cells of the NAND nonvolatile memory. This solution is discussed in, for example, US Patent Application Publication 2008/0283898, which cites Daewoong Kang et al., "Improving the Cell Characteristics Using Low-k Gate Spacer in 1 Gb NAND Flash Memory", 2006 International Electron Devices Meeting, Technical Digest, December 2006, all of which are incorporated by reference.

NAND nonvolatile memory has advanced with the use of charge trapping material such as silicon nitride, to replace the floating gate. The floating gate is heavily doped polysilicon, a highly conductive equipotential material. In contrast with the floating gate, a charge trapping gate such as silicon nitride is a dielectric, and not a highly conductive equipotential material. Because charge trapping NAND nonvolatile memory does not rely on floating gates to store charge, charge trapping NAND nonvolatile memory does not have parasitic capacitance between neighboring floating gates. Accordingly, charge trapping NAND nonvolatile memory does not need air spacers between neighboring cells of the NAND nonvolatile memory, to address parasitic capacitance between neighboring floating gates.

The paper by Kang et al. discloses a memory cell with an aspect ratio, or ratio of gate height to channel width, of about 1. Because of the relatively wide trench between neighboring memory cells, this paper discloses the necessity of many steps to form an air gap between neighboring memory cells.

Another NAND nonvolatile memory advance is the continued scaling of size. NAND nonvolatile memory at sub-20 nm and sub-30 nm sizes have been successfully fabricated and characterized. Hang-Ting Lue et al., "Scaling Evaluation of BE-SONOS NAND Flash Beyond 20 nm", 2008 Symposium on VLSI technology, Digest of Papers, June 2008, incorporated by reference. At these sizes and lower sizes, techniques such as double patterning can be applied to manufacture NAND nonvolatile memory. Yi-Shiang Chang et al., "Pattern Decomposition and Process Integration of Self-Aligned Double Patterning for 30 nm Node NAND FLASH Process and Beyond", Optical Microlithography XXII, Proceedings of the SPIE, Volume 7274, pp. 72743E-1-72743E-8, 2009; Huixiong Dai et al., "Implementing Self-Aligned Double Patterning on Non-Gridded Design Layouts", Proceedings of the SPIE, Volume 7275, pp. 72751E1-72751E-11, 2009; Andrew J. Hazelton et al., "Double patterning requirements for optical lithography and prospects for optical extension without double patterning", J. Micro/Nanolith. MEMS MOEMS, Vol. 8, pp. 011003-1-011003-11, 2009; all incorporated by reference.

SUMMARY

Analysis results presented herein show that charge-trapping NAND Flash beyond the sub-30 nm node suffer various interference disturbs. Edge fringing field due to bias voltages applied to adjacent word lines is a major factor effecting device performance not only in the initial cell characteristics but also in the programming/erasing efficiency. Analysis results show that, beyond the sub-20 nm node, devices with an oxide spacer between wordlines have more than a 2V $V_T$ shift with a word line bias of 7V. In addition, the interference from programmed charge in adjacent devices is less than 200 mV in the sub-30 nm node.

The low-k spacer described herein suppresses the edge fringing field and results in improved performance. In addition, the low-k spacer is also shown to confine the E-field within the bottom tunnel dielectric of the memory cell, which can further improve programming/erasing efficiency. As a result, the memory cells described herein can be implemented for the 20 nm node and below, including for the 15 nm node and below.

An aspect of the technology is an integrated circuit memory device, comprising a semiconductor body, charge storage structures, gates, and insulating structures having a relative dielectric constant with respect to vacuum that is less than a relative dielectric constant of silicon oxide.

The charge storage structures are arranged in series on the semiconductor body, and are separated by insulating structures. The charge storage structures include dielectric charge trapping locations beneath the gates. The charge storage structures including a tunnel dielectric structure disposed above the semiconductor body, a charge storage layer disposed above the tunnel dielectric structure, and an insulating layer disposed above the charge storage layer.

The gates are arranged in series and control the charge storage structures beneath the gates. In some embodiments, the gates have an aspect ratio greater than 3, the aspect ratio being equal to a ratio of a height of the gates to a channel width between neighboring gates.

In some embodiments, the gates are positioned sufficiently close together, such that in response to one or more of the gates having a pass gate voltage, the gates having the pass gate voltage have fringing electric fields that occupy most of at least one of the insulating structures that separate neighboring charge storage structures from the charge storage structures beneath the gates with the pass gate voltage.

The fringing electric fields are suppressed, by the insulating structures occupied by the fringing electric fields, from entering the neighboring charge storage structures. In some embodiments, the insulating structures suppress the fringing electric fields from entering a channel region. This suppresses the short channel effects despite the small dimensions of the devices.

In some embodiments, in response to one or more of the gates having a programming gate voltage, fringing fields adjacent to the insulating layer of the charge storage structures beneath the gates having the programming gate voltage, are suppressed by the insulating structures that separate neighboring charge storage structures from the charge storage structures beneath the gates with the programming gate voltage. In some embodiments, fringing fields adjacent to at least the tunnel dielectric structure portion of the insulating layer are suppressed. In some embodiments, due to this suppression of fringing fields adjacent to at least the tunnel dielectric structure, the tunnel dielectric structure has a lateral voltage variation from the fringing fields of no more than a volt between a center of the tunnel dielectric structure and an edge of the tunnel dielectric structure.

The insulating structures have various embodiments. Other embodiments have a relative dielectric constant less than a relative dielectric constant of silicon nitride. Other embodiments have a relative dielectric constant less than relative dielectric constants of materials in the tunnel dielectric structure. Various embodiments of the insulating structures include any of air, fluorinated silica glass, carbon doped silicon oxide, and spin-on polymer dielectric. In some embodiments, the insulating structures between neighboring charge storage structures are air, and lack wing spacers The insulating structures are covered by various structures in various embodiments. In one embodiment, a polymer thin film caps the insulating structures and the gates, and the insulating structures are air. In one embodiment, mushroom-shaped dielectric structures cap the insulating structures and the gates, and the insulating structures are air.

Some embodiments have a controller which applies multiple gate voltage settings to the gates.

Some embodiments have a BE-SONOS structure memory cells. The tunnel dielectric structure disposed above the semiconductor body comprises a first silicon oxide layer adjacent a channel of the semiconductor body and having a thickness of 18 Å or less, a silicon nitride layer on the first silicon oxide layer having a thickness of 30 Å or less, and a second silicon oxide layer on the silicon nitride layer having a thickness of 35 Å or less; and the charge storage layer comprises silicon nitride having a thickness of 50 Å or more; and the insulating layer comprises a blocking dielectric layer of silicon oxide.

Another aspect of the technology is an integrated circuit memory device, comprising a semiconductor body, charge storage structures, gates, and insulating structures. The aspect is similar to the prior aspect. However, the gates arranged in series are positioned sufficiently close together, such that in response to one or more of the gates having a programming gate voltage, fringing fields adjacent to the insulating layer of the charge storage structures beneath the gates having the programming gate voltage, are suppressed, by the insulating structures that separate neighboring charge storage structures, from entering the charge storage structures beneath the gates with the programming gate voltage. Some embodiments have this described response to the programming gate voltage and the above described response to a pass gate voltage.

Another aspect of the technology is a method for forming an integrated circuit memory device, comprising:

forming a plurality of charge storage structures arranged in series on a semiconductor body, the charge storage structures including dielectric charge trapping locations, the charge storage structures including a tunnel dielectric structure disposed above the semiconductor body, a charge storage layer disposed above the tunnel dielectric structure, and an insulating layer disposed above the charge storage layer; and forming a plurality of gates arranged in series controlling the charge storage structures beneath the gates; and forming insulating structures separating the charge storage structures, wherein the gates are positioned sufficiently close together, such that in response to one or more of the gates having a pass gate voltage, the gates having the pass gate voltage have fringing electric fields that occupy most of at least one of the insulating structures that separate neighboring charge storage structures from the charge storage structures beneath the gates with the pass gate voltage, wherein the fringing electric fields are suppressed, by the insulating structures occupied by the fringing electric fields, from entering the neighboring charge storage structures.

Another aspect of the technology is a method for forming an integrated circuit memory device, comprising:

forming a plurality of charge storage structures arranged in series on a semiconductor body, the charge storage structures including dielectric charge trapping locations, the charge storage structures including a tunnel dielectric structure disposed above the semiconductor body, a charge storage layer disposed above the tunnel dielectric structure, and an insulating layer disposed above the charge storage layer; and forming a plurality of gates arranged in series controlling the charge storage structures beneath the gates; and forming insulating structures separating the charge storage structures, wherein the gates are positioned sufficiently close together, such that in response to one or more of the gates having a programming gate voltage, fringing fields adjacent to the insulating layer of the charge storage structures beneath the gates having the programming gate voltage, are suppressed, by the insulating structures that separate neighboring charge storage structures, from entering the charge storage structures beneath the gates with the programming gate voltage.

Another aspect of the technology is method of operating NAND nonvolatile charge trapping memory device, comprising:

suppressing fringing fields of a NAND nonvolatile charge trapping memory cell from interfering with a threshold voltage of neighboring NAND nonvolatile charge trapping memory cells in the NAND nonvolatile charge trapping memory device, with insulating structures separating the NAND nonvolatile charge trapping memory cells in the NAND nonvolatile charge trapping memory device, the insulating structures having a relative dielectric constant with respect to vacuum that is less than a relative dielectric constant of silicon oxide.

Another aspect of the technology is an integrated circuit device, comprising a plurality of cells arranged in series on a semiconductor body, such that the cells are separated by insulating structures; a plurality of controlling terminals arranged in series controlling the cells; and the insulating structures that have a relative dielectric constant with respect to vacuum that is less than a relative dielectric constant of silicon oxide.

In various embodiments, the insulating structures are any of fluorinated silica glass, carbon doped silicon oxide, and spin-on polymer dielectric.

Another embodiment includes a polymer thin film capping the insulating structures and the plurality of gates, such that the insulating structures are air.

Another aspect of the technology is an integrated circuit device, comprising a plurality of cells arranged in series on a semiconductor body, such that the cells are separated by insulating structures; a plurality of controlling terminals with an aspect ratio greater than 3, such that the aspect ratio is equal to a ratio of a height of the plurality of controlling terminals to a width between neighboring controlling terminals, such that the plurality of controlling terminals are arranged in series controlling the cells; and the insulating structures which have a relative dielectric constant with respect to vacuum that is less than a relative dielectric constant of silicon oxide.

BRIEF DESCRIPTION OF THE DRAWINGS

FIG. 3A shows the various interference modes for selected memory cell Cell_5 of FIG. 2B.

DETAILED DESCRIPTION

An innovative technology to suppress the interference beyond sub-30 nm node charge-trapping NAND Flash is described herein, resulting in high density charge trapping memory cells having improved performance. Analysis results presented herein show that, because the effective oxide thickness (EOT) (>15 nm) of charge trapping memory cells is comparable with the memory cell dimension (F), edge fringing field effect interference caused by voltages applied to adjacent wordlines can be more significant than the interference caused by programmed charge within adjacent cells. The EOT is defined as the thickness of the dielectric layers scaled by the ratio of the dielectric constant of silicon dioxide to the dielectric constant of the material of the layer.

A low-k spacer between wordlines in the array is shown herein to be very effective in suppressing the interference from both the edge fringing field due to bias voltages applied to adjacent wordlines, as well as from programmed charge in adjacent cells. As a result, memory cell NAND arrays with a half pitch of 15 nm and below are shown to have low interference.

As used herein, the term "low-k" refers to a permittivity (k) less than that of silicon dioxide, silicon dioxide having a permittivity of approximately 3.9. Low-k spacers described herein include one or more dielectric materials with a k less than that of silicon dioxide (k<3.9) which fill the space between the word lines, as well a gas-filled void which may substantially or entirely fill the space between the word lines, so that the effective k of the spacer is less than that of silicon dioxide.

Using a low-k spacer as described herein is also shown to also suppress the short channel effect. In addition, programming/erasing efficiency is also improved due to the confined E-field within the bottom tunnel dielectric of the memory cell.

Figure 1:
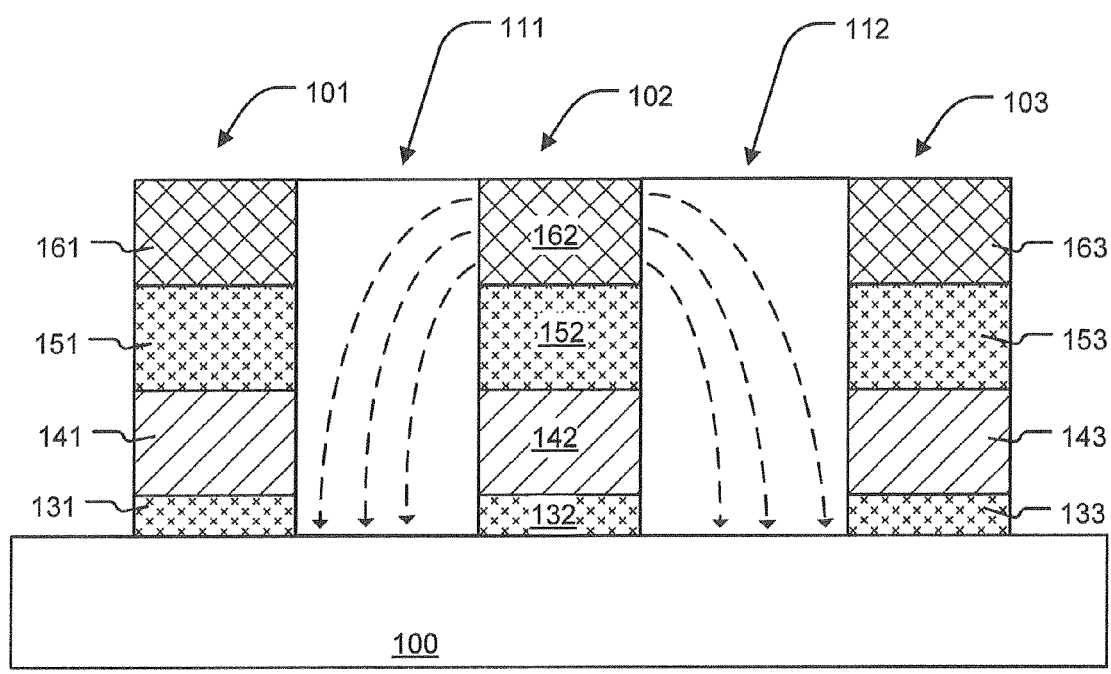
FIG. 1 illustrates a cross-sectional view of a NAND memory device.

FIG. 1 illustrates a cross-sectional view of a NAND memory device (not to scale) formed on a semiconductor substrate 100. Various embodiments of the NAND device are junction-free or junction based, depending on the presence or absence of junctions in the substrate 100 between neighboring memory cells in a given NAND string of memory cells. The NAND strings include memory cells 101, 102, and 103, separated by gaps that are filled with low-k dielectric structures 111 and 112.

A tunneling dielectric layer 131 comprising for example, silicon dioxide or silicon oxynitride, overlies the channel region of the substrate 100, a dielectric charge storage layer 141 comprises silicon nitride and is on the tunneling dielectric layer 131, a blocking dielectric layer 151 comprises silicon dioxide in this example and is on the charge storage layer 141, and a gate 161 for example comprising p-type or n-type polysilicon is on the blocking dielectric layer 151. Alternative embodiments using a multi-layer blocking layer can be implemented. A higher work function material may be used in addition to or in place of the polysilicon in contact with the blocking layer 151, such as tantalum, titanium, platinum, tantalum nitride, titanium nitride and so on. A variety of high work function materials suitable for use as a gate material are described in U.S. Pat. No. 6,912,163, which is incorporated by reference herein.

The memory cell is programmed and erased by applying appropriate voltages to the gate 161, and substrate 100 of the memory cell to induce an electric field between the gate 161 and substrate 100. A junction based embodiment will also have biased doped regions in the substrate 100. The memory cell can be programmed, for example, by tunneling of electrons into the charge storage layer 141 using one of a number of well-known biasing techniques (for example, Fowler Nordheim (FN) tunneling, Channel Hot Electron (CHE), etc.). The memory cell can be erased, for example, by hole tunneling from the substrate 100 into the charge storage layer 141 or by electron de-trapping from the charge storage layer 141.

In the shown NAND device, the memory cell 102 receives a pass gate voltage at gate 162. Fringing electric fields result, which are electric fields that are not confined within the memory cell 102 with its gate and charge storage structure. The fringing fields fill most of the neighboring dielectric/insulating structures 111 and 112. Because of the choice of low-k material(s) for the insulating structures 111 and 112, the fringing electric fields are suppressed from entering the charge storage structures of neighboring memory devices 101 and 103. In prior, larger dimension lithographic nodes, the fringing fields did not fill the gaps between neighboring charge storage structures in this fashion, because the height of the charge storage structure, and its equivalent oxide thickness, was much smaller, relative to the pitch of the NAND memory cells.

An explanation of the suppression of the fringing fields follows. According to Faraday's Law, the following two are equal:

i) a line integration over a contour, of the dot product of i)a) an electric field and i)b) the incremental vector dl along the contour, and ii) the negative of the surface integral over the surface enclosed by the contour, of the dot product of ii)a) the partial derivative of the magnetic B field with respect to time and ii)b) the surface vector of the incremental surface dS.

Applying Faraday's Law to a cylindrical surface straddling two different materials, the tangential component of the electrical field is continuous across the interface between the two materials.

According to Gauss's law, the following two are equal:

i) a surface integral of a surface enclosing a volume, of the dot product of i)a) an electric flux density D and i)b) the surface vector of the incremental surface dS, and ii) the volume integral over the enclosed volume of the volume charge density at each incremental volume dv.

Applying Gauss's Law to a cylindrical surface straddling two different materials, the normal component of the electrical flux density D is continuous across the interface between the two materials, excepting surface charge at that interface.

Electric flux density D is equal to the electrical field E multiplied by the permittivity $\epsilon$, where the permittivity $\epsilon$ is the product of the relative permittivity K and the permittivity of free space $\epsilon_0$. Accordingly, when applying Gauss's Law to a cylindrical surface straddling a low-K spacer and a higher-K word line stack, a particular normal electrical field in the low-K spacer, will correspond to a lower normal electrical field in the higher-K word line stack, scaled down by a factor of the ratio of the relative permittivities of the low-K spacer to the higher-K word line stack.

Figure 2A:
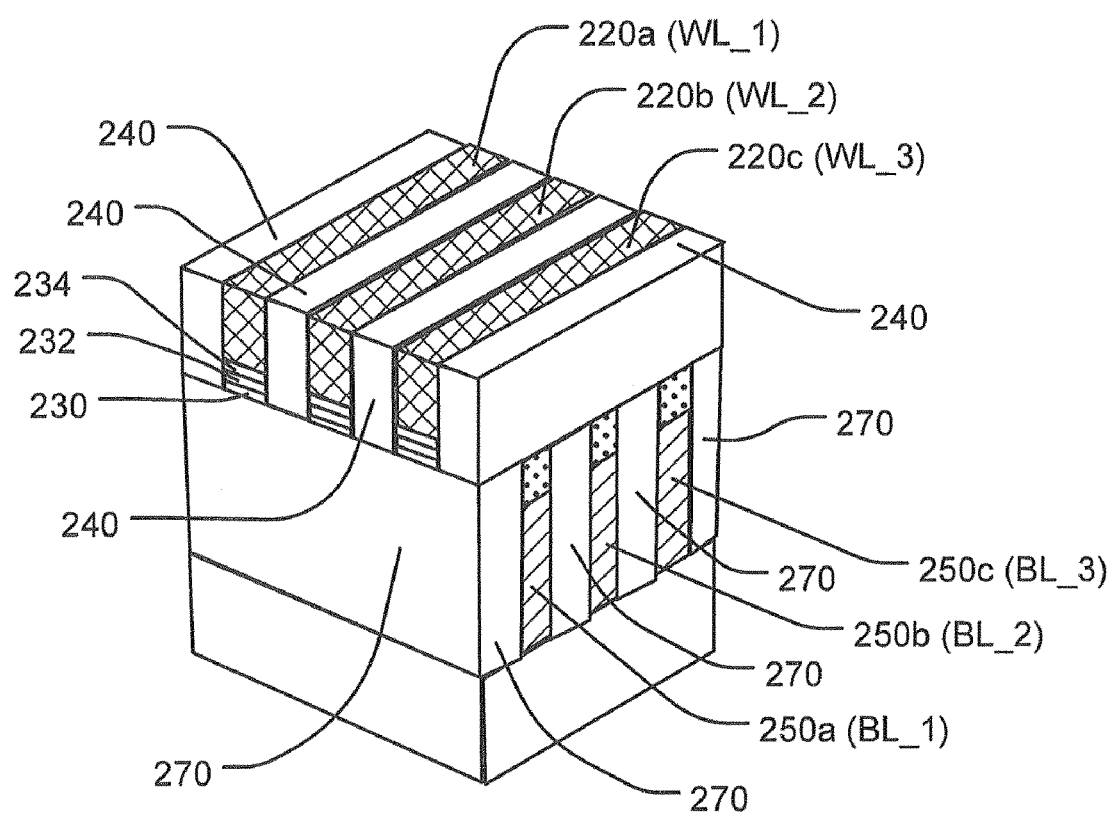
FIG. 2A is a structure of a charge-trapping NAND memory device.

FIG. 2A is a structure of a charge-trapping NAND charge trapping memory device, for which simulated results are presented herein. In alternative embodiments, other types of array configurations can also be used.

The device 200 includes wordlines 220 acting as gates for the charge-trapping memory cells of the device 200. The wordlines 220 overlie the tunneling dielectric layer 230, a dielectric charge storage layer 232, and blocking dielectric layer 234 of the memory cells of the array. Spacers 240 separate the wordlines 220. The device 200 also includes bit lines 250, separated by shallow trench isolation structures 270.

In the simulated results presented below, the wordlines 220 comprise P+ doped polysilicon, the tunneling dielectric layer 230 comprises silicon dioxide having a thickness of 5 nm, the dielectric charge storage layer 232 comprises silicon nitride having a thickness of 6 nm, the blocking dielectric layer 234 comprises silicon dioxide having a thickness of 6 nm, the shallow trench isolation structures comprise silicon dioxide, and the substrate/junction doping concentrations are 1E18 $cm^{-3}$ and 5E19 $cm^{-3}$ respectively, unless otherwise noted. In the simulated results presented below, the half-pitch ranges from 50 to 15 nm. The full pitch is the period of the memory pattern. It will be understood that the materials, thicknesses, doping concentrations, etc. used for the memory device 200 will vary from embodiment to embodiment.

Figure 2B:
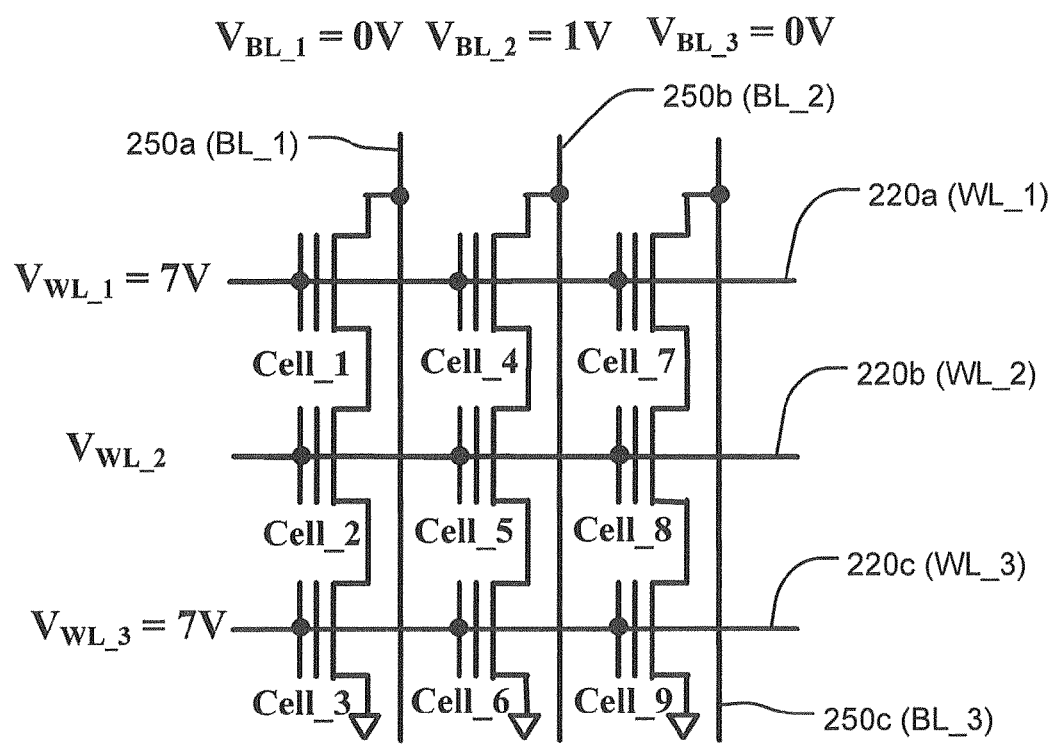
FIG. 2B is the equivalent circuit with a default bias condition.

FIG. 2B is the equivalent circuit with a default bias condition for the device 200 of FIG. 2A, along with a read bias arrangement applied to evaluate interference issues of a selected memory cell Cell_5. In FIG. 2B the read bias arrangement comprises 7V applied to wordlines 220a and 220c, 0V applied to bit lines 250a and 250c, 1V applied to bit line 250b, and ground applied to the sources of Cell_3, Cell_6, and Cell_9. Alternatively, the voltages for the read bias arrangement can be different.

FIG. 3A is a table of the various interference modes from adjacent programmed cells for selected memory cell Cell_5 of FIG. 2B. The first column of the table is the name of the disturb mode used herein, and the second column lists which of the memory cells of the device 200 are programmed for each disturb mode. For example, in the "WL" disturb mode Cell_4 and Cell_6 are in the programmed state, while Cell_1, Cell_2, Cell_3, Cell_7, Cell_8, and Cell_9 are in the erased state.

In the simulation results below, the dielectric charge trapping layer 232 of each of the cells in the programmed state have an electron density of 2E19 $cm^{-3}$ (equivalent to a shift in $V_T$ of about 4.2 V), while the other cells are in the erased state and have no charge stored in layer 232. Alternatively, the electron density for each of the states can be different.

Figure 3B:
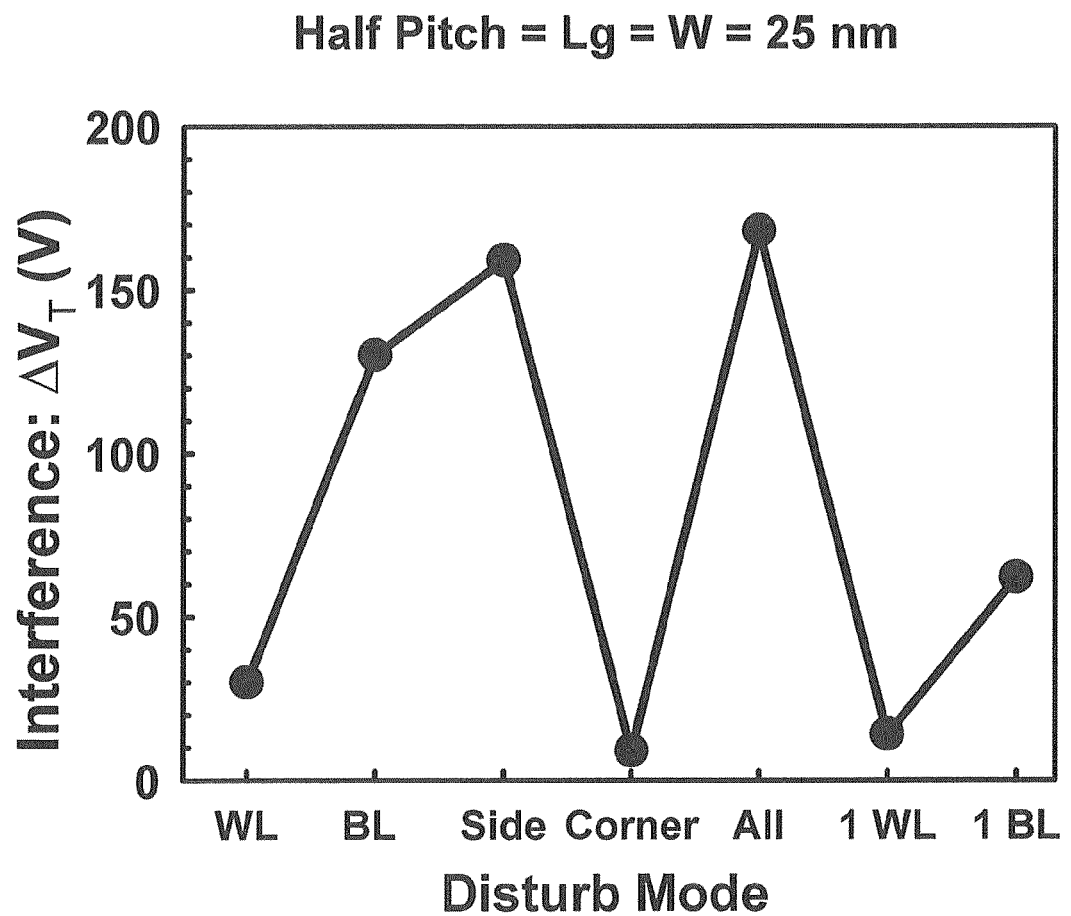
FIG. 3B shows the interference disturb of memory cell 5 for the various interference modes of FIG. 3A.

FIG. 3B shows the simulated change in the threshold voltage $V_T$ (interference) of selected Cell_5 of FIG. 2B (initially in the erased state) due to the read bias arrangement for each of the interference modes of the table of FIG. 3A. In the results of FIG. 3B the spacers 240 between the wordlines 220 comprise silicon dioxide with a k of 3.9, and the half-pitch (feature size) is 25 nm. In FIG. 3B the maximum interference is within 200 mV.

The above simulated data prove that threshold voltage interference is negligible, from the programmed charge storage layer of neighboring memory. Even the worst case of the disturb mode "All", in which all neighboring memory cells are programmed, results in a maximum threshold voltage disturbance of less than 0.2 V.

Figure 4:
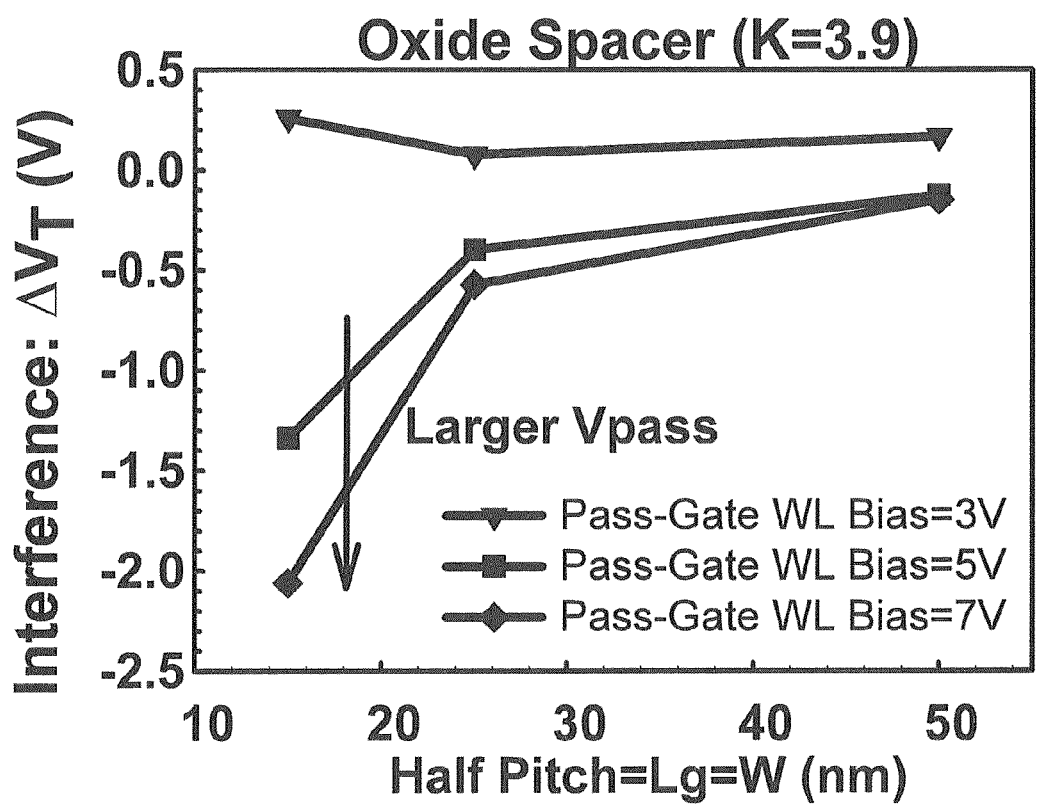
FIG. 4 shows the interference from bias voltages applied to word lines adjacent memory cell 5.

FIG. 4 is the simulated interference of Cell_5 versus the adjacent pass-gate wordline bias using silicon dioxide spacers 240 between the wordlines 220. As can be seen in FIG. 4, as the half-pitch is reduced below 20 nm the interference from the wordline bias voltages becomes much more severe. As can also be seen, larger voltages on the wordlines 120 also cause larger shifts in $V_T$. Pass-gate voltages of over 5V cause significant threshold voltage interference of neighboring memory cells. At a 25 nm half-pitch, threshold voltage interference is about −0.5 V. At a 15 nm half-pitch, threshold voltage interference is about −1.3 V for a pass-gate voltage of 5V, and about −2.1 V for a pass-gate voltage of 7V. Accordingly, a small half-pitch below 20 nm and a high pass-gate voltage over 5V, result in a pass gate that helps to turn on the neighboring memory cell. With pitch scaling downwards and a fixed EOT, the ratio of EOT/full pitch becomes larger. The impact of fringing field also becomes correspondingly larger, and a severe $V_T$ roll-off trend is found in the conventional oxide spacer.

Figure 5A:
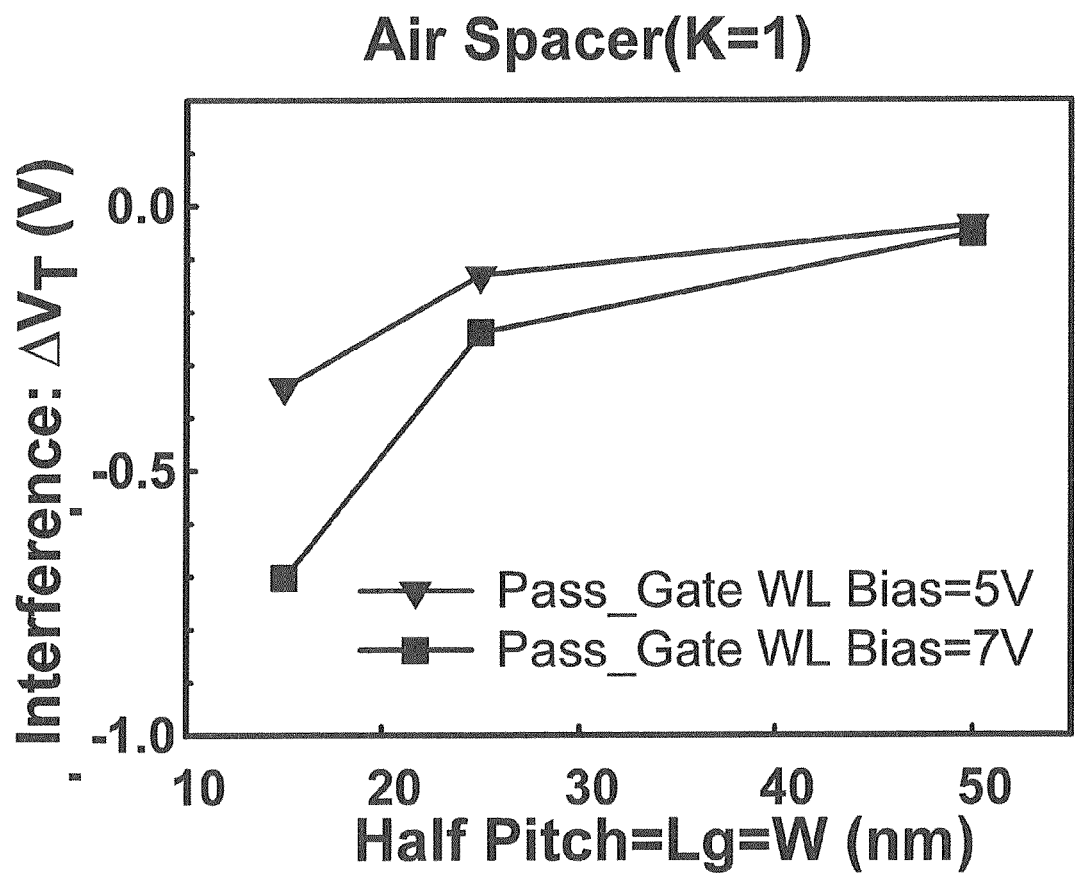
FIG. 5A shows the suppressed interference from adjacent pass WL's with a low-k spacer between WL's.

FIG. 5A shows the suppressed interference from adjacent pass WL's with a low-k spacer between WL's. In particular, FIG. 5A is the simulated interference of Cell_5 for air-filled spacers 240 (k of approximately 1). As can be seen in FIG. 5A, compared with FIG. 4 the interference is significantly suppressed. At a 25 nm half-pitch, threshold voltage interference is about −0.2 V. At a 15 nm half-pitch, threshold voltage interference is about −0.3 V for a pass-gate voltage of 5V, and about −0.7 V for a pass-gate voltage of 7V. In contrast with FIG. 4, by using a low-k spacer, the $V_T$ roll-off trend is released. Therefore, the minimum spacing between neighboring NAND cells with an acceptable fringing field can be found in a pitch with acceptable interference value. The maximum spacing between neighboring NAND cells at which the low-k spacers become useful to suppress fringing electric fields, can be characterized by comparing these FIGS. 4 and 5A. The maximum spacing occurs at the pitch that unacceptable interference occurs with the oxide spacer but not with the low-k spacer.

Figure 5B:
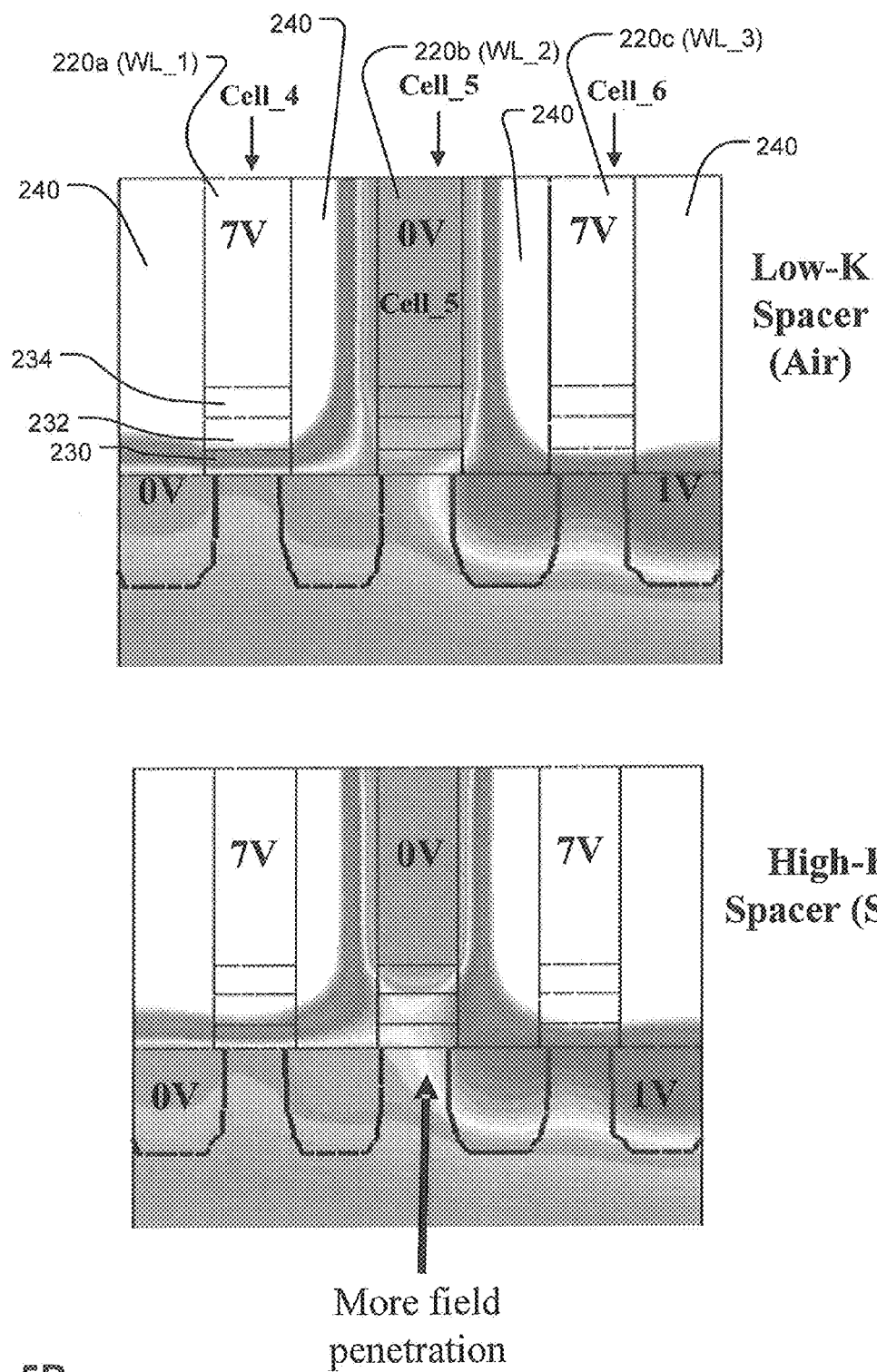
FIG. 5B shows an electropotential distribution with suppressed interference from adjacent pass WL's.

FIG. 5B shows electropotential distributions with suppressed interference from adjacent pass WL's using spacers 240 of air (k=1, top figure), in contrast with silicon nitride (k=7, bottom figure). As can be seen in FIG. 5B, with the spacer 240 of air rather than silicon nitride the channel and the charge storage structure of the memory cell Cell_5 has a smaller electrostatic potential. The electropotential distribution with air spacers shows that the charge storage structure is substantially 0V, with some field penetration of about 1 V on the right portion of the channel and the bottom-right portion of the tunnel dielectric structure. In contrast, the electropotential distribution with nitride spacers shows that the charge storage structure is substantially 0V only at the word line and the insulating layer, with field penetration of about 1 V throughout the charge storage layer, the tunnel dielectric structure, and the channel.

Figure 6A:
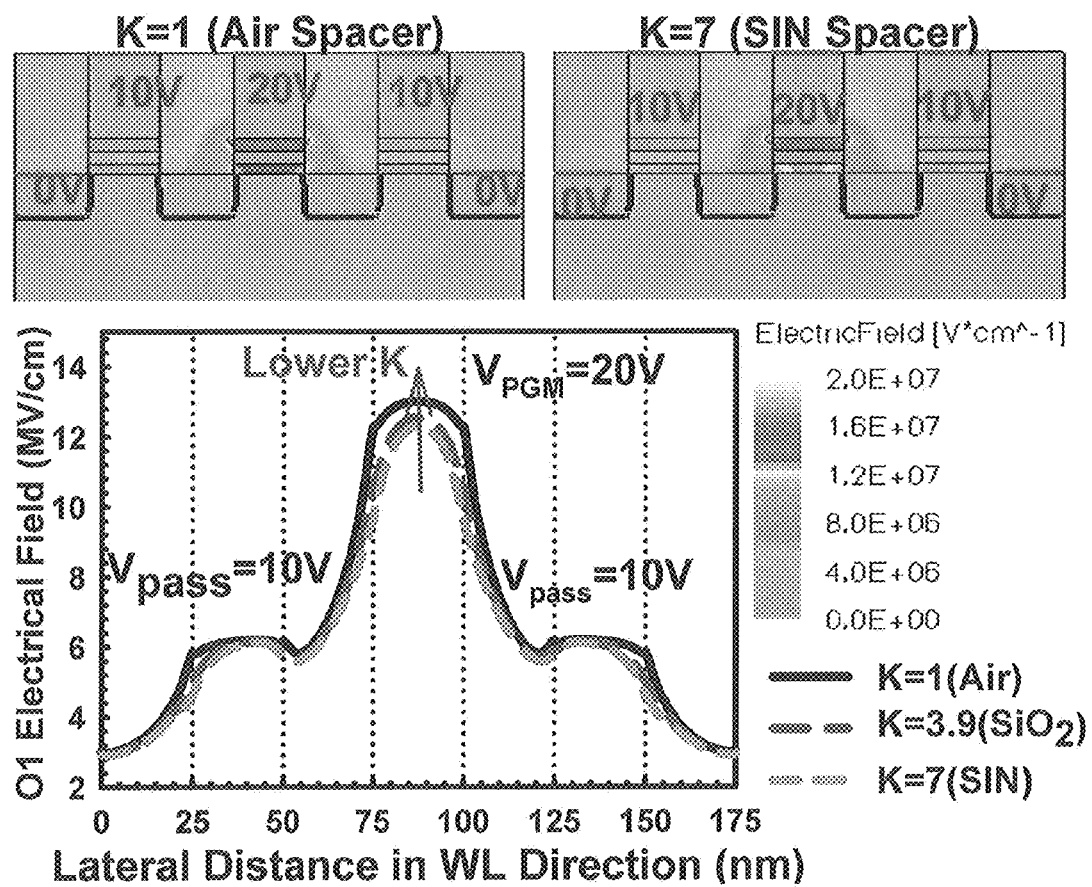
FIG. 6A shows the bottom tunnel dielectric E-field distribution for different spacer materials.
Figure 6B:
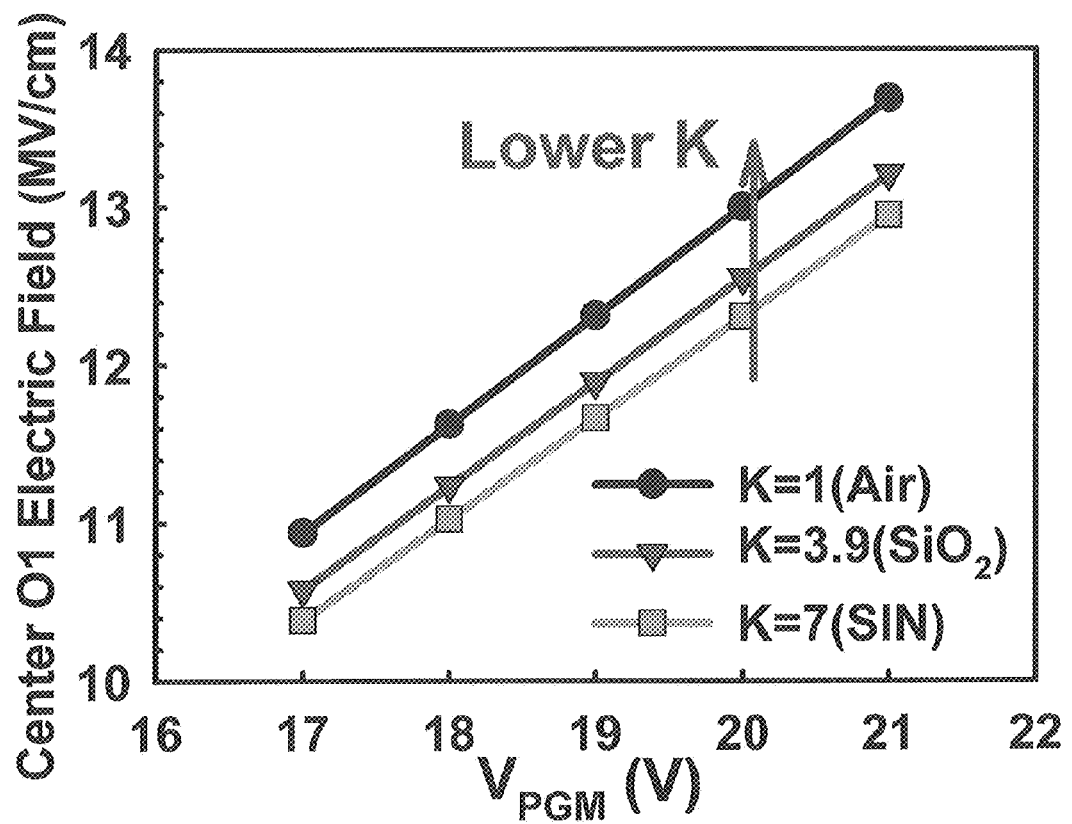
FIG. 6B shows the bottom tunnel dielectric E-field under various programmed voltages applied to the selected cell.

FIG. 6A shows the bottom tunnel dielectric E-field distribution for different spacer materials. FIG. 6A shows the electrical field in the dielectric charge storage layer 232 of Cell_5 under +FN programming condition (Vpgm/Vpass=20/10V) for a 25 nm NAND. As can be seen in FIG. 6A, as the k of the spacer is reduced the electric field in the dielectric charge storage layer 232 of Cell_5 increases and also becomes broader in the wordline direction, as the spacer suppresses fringing fields from exiting the charge storage structures. With air spacers, both the upper insulating layer and the bottom tunnel dielectric structure have a fairly laterally uniform voltage of about 14 V. With nitride spacers, fringing fields substantially exit from the charge storage structure into the spacers, such that the bottom tunnel dielectric structure has a laterally substantially varying voltage of about 13 V in the center and about 11V at the edges. FIG. 6B is the simulated electric field dielectric charge storage layer 232 of Cell_5 at the center of the tunnel dielectric structure, under varying +FN programming bias conditions. The low-k spacer increases the center E-field and decreases the variation between the center and the edge, which suggests that the low-k spacer will increase the programming/erasing efficiency. This is because the low-K spacer helps to confine the electric field and thus it has a less degraded electric field at the center of the tunnel dielectric structure.

Figure 7A:
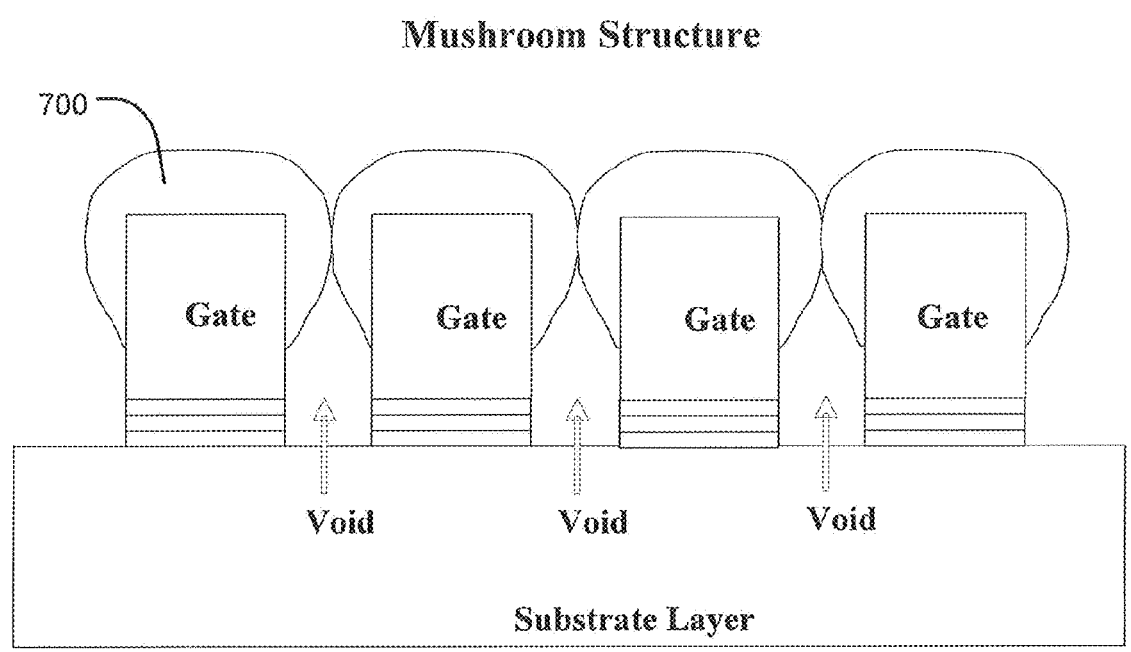
FIG. 7A is a cross-sectional view of a first embodiment of a memory array having a low-k spacer between the word lines as described herein.

FIG. 7A is a simplified cross-sectional view of a first embodiment of a memory array having a low-k spacer between the wordlines, the wordlines acting as gates of the charge-trapping memory cells. Following patterning of the wordlines to form gaps therebetween, material 700 with very poor gap filing capability is deposited on the wordlines so that voids consisting of gas that was used in the deposition process remaining between the wordlines, resulting in a mushroom structure as shown in FIG. 7A. An ONO stack is between the gate and the substrate.

Figure 7B:
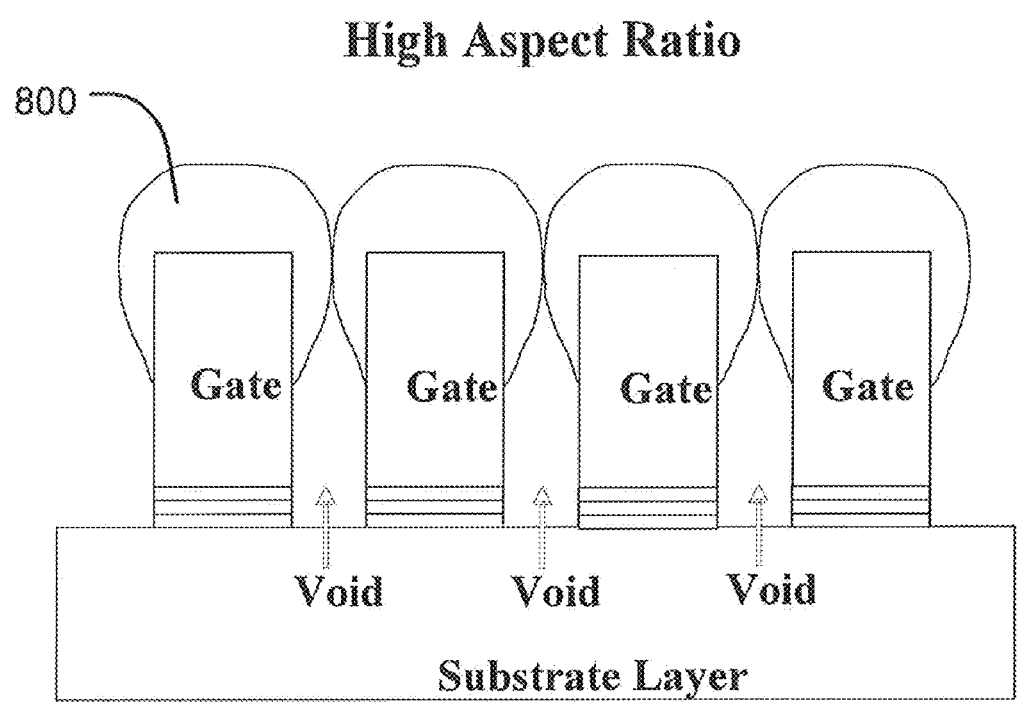
FIG. 7B is a cross-sectional view of a second embodiment of a memory array having a low-k spacer between the word lines as described herein.

FIG. 7B is a simplified cross-sectional view of a second embodiment of a memory array having a low-k spacer between the wordlines. In FIG. 7B the gate material is thicker than that of FIG. 7A, resulting in higher aspect ratio openings between the wordlines. The higher aspect ratio of the opening between the wordlines helps prevent the subsequently formed dielectric 800 from filling the space between the wordlines and results in voids as shown. An ONO stack is between the gate and the substrate. A height/width ratio greater than 10 is difficult to etch. An aspect ratio, or ratio of gate height to channel width, larger than 3, is favorable, because of the relatively narrow trench between neighboring memory cells, making it easier to form an air gap between neighboring memory cells. If the aspect ratio is greater than 3, it is easier to form an air gap, because the trench is harder to fill with low-k material. Accordingly, extra steps in the paper by Kang et al. are unnecessary. For example, the insulating structures (which separate neighboring charge storage structures) do not have nitride wing spacers.

Figure 8A:
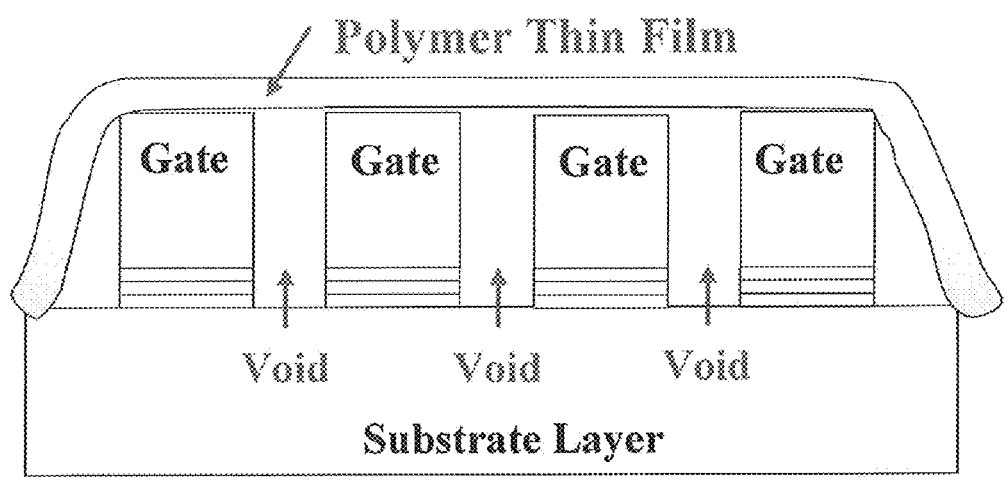
FIG. 8A is a cross-sectional view of a third embodiment of a memory array having a low-k spacer between the word lines as described herein.

FIG. 8A is a simplified cross-sectional view of a third embodiment of a memory array having a low-k spacer between the wordlines. In FIG. 8A a thin film polymer membrane is formed on the wordlines that does not fill the openings, resulting in the formation of voids as shown. An ONO stack is between the gate and the substrate.

Figure 8B:
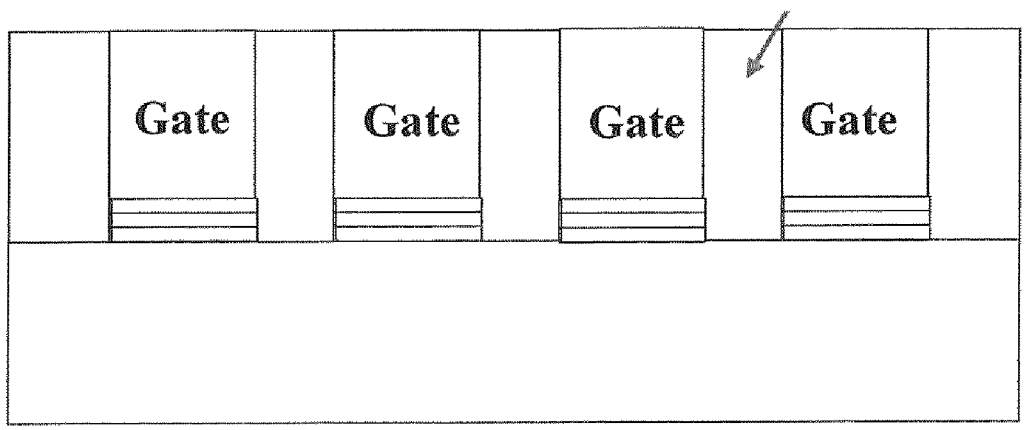
FIG. 8B is a cross-sectional view of a fourth embodiment of a memory array having a low-k spacer between the word lines as described herein.

FIG. 8B is a simplified cross-sectional view of a fourth embodiment of a memory array having a low-k spacer between the wordlines. In FIG. 8B the space between the wordlines is filled with one or more materials having a k less than that of silicon dioxide. The spaces can be filled by depositing the low-k material on the wordlines and within the openings, and performing a planarizing process or etch back to expose the top surfaces of the wordlines. Examples of low-k materials that can be used include, for example, FSG (fluorinated silicate glass, k<3.5), Black diamond (Applied Materials, k=2.6~3.0), SiLK (k=2.6~2.8), and Coral (k=2.7~2.9). An ONO stack is between the gate and the substrate.

Additional details of the present invention are described in "A Study of Stored Charge Interference and Fringing Field Effects in Sub-30 nm Charge Trapping NAND Flash" by Hsiao, et al., which is attached hereto and incorporated by reference herein.

The memory cell devices described above were implemented as SONOS type memory cells. Alternatively, the low-k spacers described can be implemented in other types of charge trapping memory cell arrays. For example, the low-k spacers can be implemented in Bandgap Engineered SONOS (BE-SONOS) devices. In one such embodiment, the tunneling layer 230 of the memory cells of FIG. 2A is replaced with a tunneling dielectric structure comprising a bottom dielectric layer of silicon dioxide less than 2 nm thick (such as about 1.3 nm), a middle dielectric layer of silicon nitride less than 2.5 nm thick (such as about 2 nm) on the bottom dielectric layer, and a top dielectric layer of silicon dioxide less than 3.5 nm thick (such as about 2.5 nm) on the middle dielectric layer. Other thicknesses can also be used. BE-SONOS technology has been proven to provide excellent performance, overcoming many of the erase speed, endurance and charge retention issues of prior art SONOS type memory.

For further information on BE-SONOS devices, attached hereto and incorporated by reference herein is U.S. patent application Ser. No. 12/182318 entitled "High-K Capped Blocking Dielectric Bandgap Engineered SONOS and MONOS", filed on 30 Jul. 2008.

Figure 9:
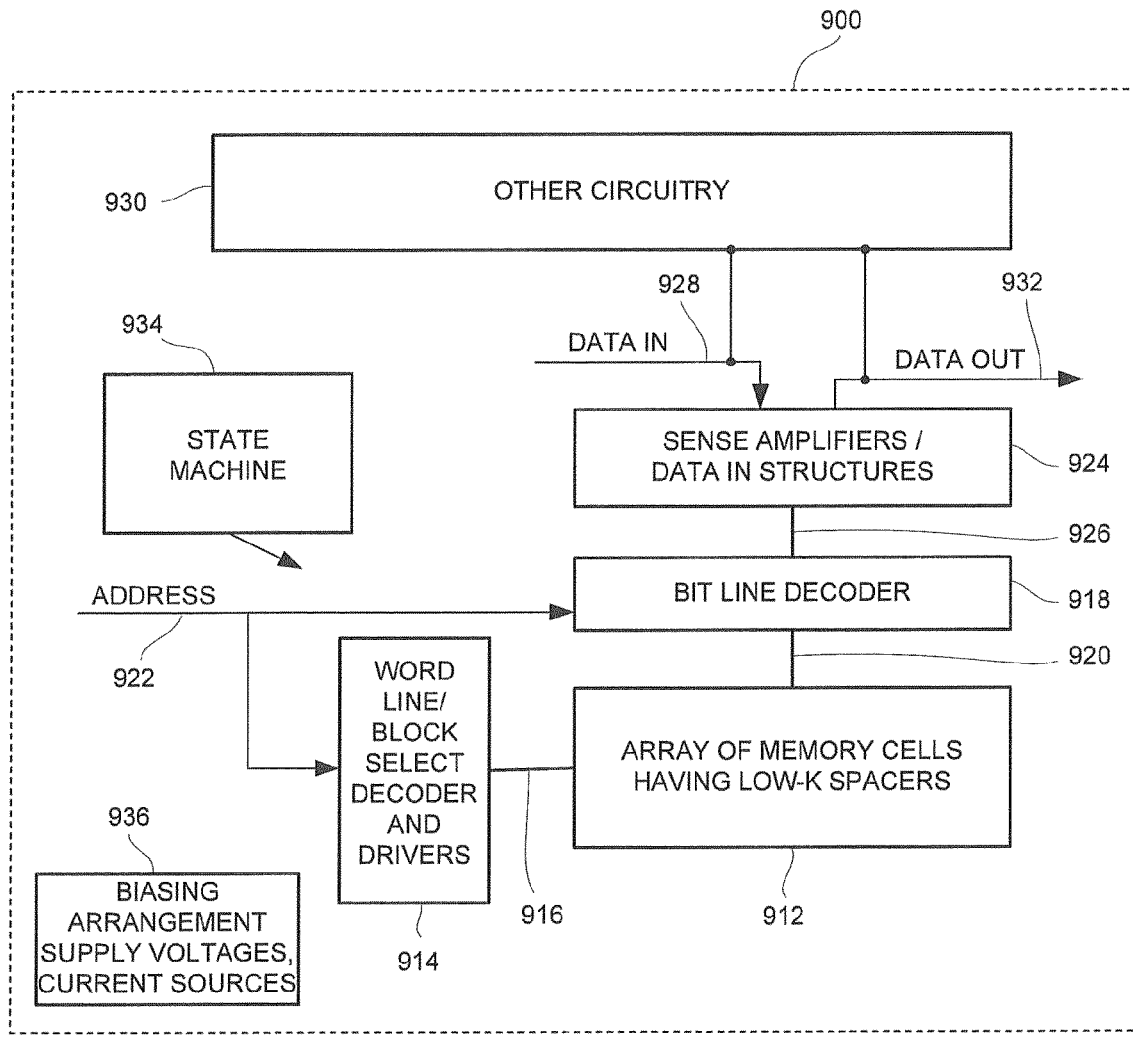
FIG. 9 is a simplified block diagram of an integrated circuit including a memory array implemented using dielectric charge trapping memory cells having low-k spacers as described herein.

FIG. 9 is a simplified block diagram of an integrated circuit 900 including a memory array 912 implemented using dielectric charge trapping memory cells having low-k spacers as described herein. A word line (or row) and block select decoder 914 is coupled to, and in electrical communication with, a plurality 916 of word lines and string select lines, and arranged along rows in the memory array 912. A bit line (column) decoder and drivers 918 are coupled to and in electrical communication with a plurality of bit lines 920 arranged along columns in the memory array 912 for reading data from, and writing data to, the memory cells in the memory array 912. Addresses are supplied on bus 922 to the word line decoder and drivers 914 and to the bit line decoder 918. Sense amplifiers and data-in structures in block 924, including current sources for the read, program and erase modes, are coupled to the bit line decoder 918 via the bus 926. Data is supplied via the data-in line 928 from input/output ports on the integrated circuit 910, to the data-in structures in block 924. In the illustrated embodiment, other circuitry 930 is included on the integrated circuit 900, such as a general purpose processor or special purpose application circuitry, or a combination of modules providing system-on-a-chip functionality supported by the memory cell array. Data is supplied via the data-out line 932 from the sense amplifiers in block 924 to input/output ports on the integrated circuit 1000, or to other data destinations internal or external to the integrated circuit 1000.

The array 912 can be a NAND array, an AND array or a NOR array, depending on the particular application.

A controller implemented in this example, using bias arrangement state machine 934, controls the application of bias arrangement supply voltages and current sources 936, such as read, program, erase, erase verify, program verify voltages or currents for the word line and bit lines, and controls the word line/source line operation using an access control process. The controller 934 may be implemented using special purpose logic circuitry as known in the art. In alternative embodiments, the controller 934 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 10:
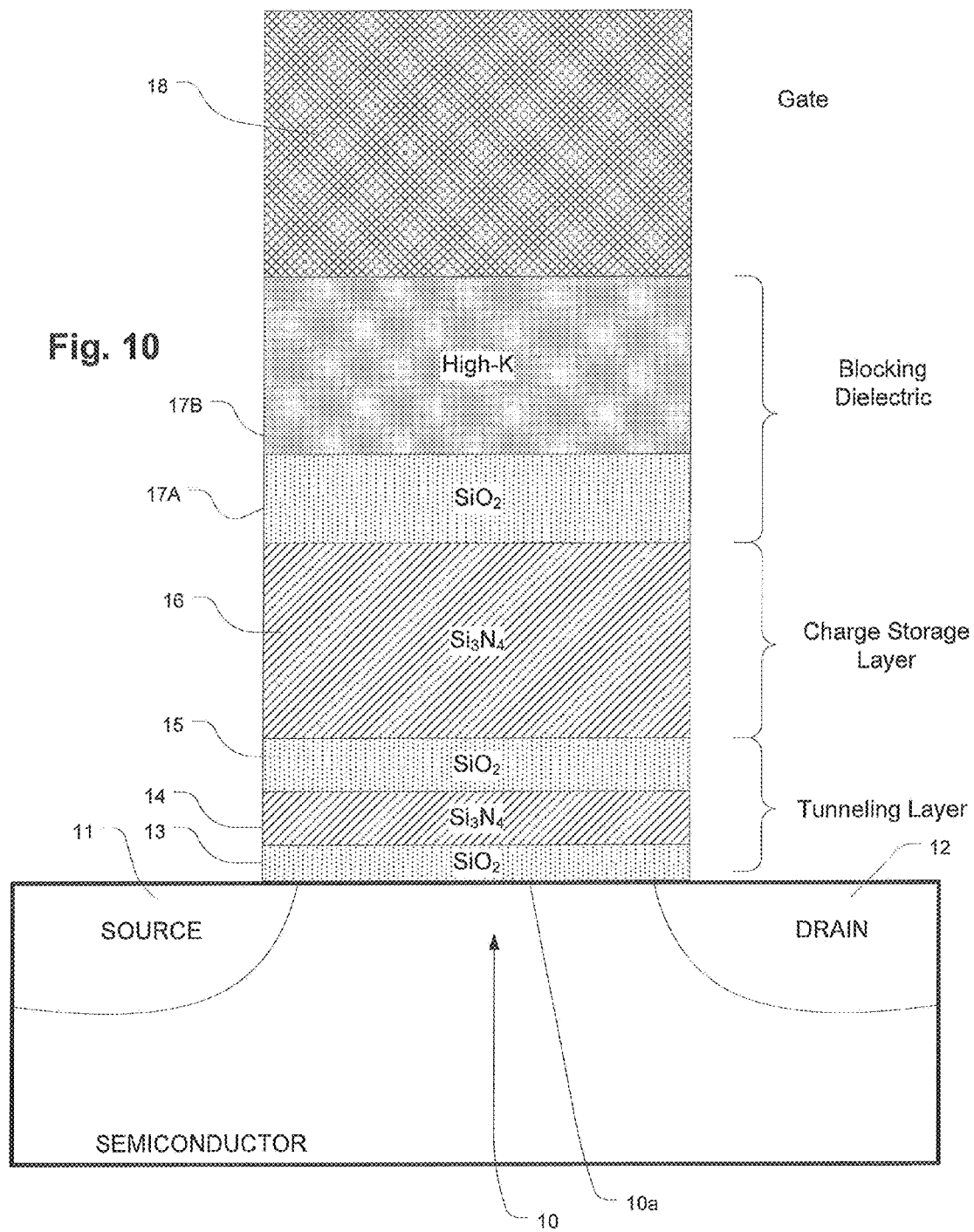
FIG. 10 is a simplified diagram of a BE-SONOS cell in the NAND array.

FIG. 10 is a simplified diagram of a charge trapping memory cell in the NAND array employing a multilayer blocking dielectric layer and a bandgap engineered dielectric tunneling layer. The memory cell includes a channel 10, a source 11 and a drain 12 adjacent the channel in a semiconductor body. A gate 18 overlies a multilayer stack, including the multilayer blocking dielectric layer, the charge trapping layer and the tunneling layer, of dielectric materials acting as the charge storage structure.

Gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 10, the dielectric tunneling layer comprises a composite of materials, including a first layer 13, referred to as a hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 20 Å, and preferably 15 Å or less. Representative embodiments are 10 Å or 12 Å thick.

A layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The thickness of the layer 14 of silicon nitride is less than 30 Å, and preferably 25 Å or less.

A second layer 15 of silicon dioxide, referred to as an isolation layer, lies on the layer 14 of silicon nitride formed for example using LPCVD high temperature oxide HTO deposition. The thickness of the second layer 15 of silicon dioxide is less than 35 Å, and preferably 25 Å or less. The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the engineered tunneling dielectric after the first location. This structure enables electric field assisted hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

In a representative device, the engineered tunneling dielectric layer consists of an ultrathin silicon oxide layer O1 (e.g. <=18 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

Embodiments of the memory cell described herein include gates comprising polysilicon, such as n+ polysilicon, or metal, such as aluminum. In alternatives, the gates comprise materials having work functions that are greater than the work functions of n+ polysilicon, including for example, p+ polysilicon, platinum, tantalum nitride, and other materials chosen for work function, conductivity and manufacturability.

The structure of the dielectric tunneling layer is described in more detail below with reference to FIGS. 11 and 12.

A charge trapping layer 16 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials are described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer in this embodiment comprises a stack including a buffer layer 17A and a high-κ capping layer 17B. High-κ herein refers to dielectric constant>7, such as found in materials including $Al_2O_3$, $HfO_2$, $ZrO_2$, $La_2O_3$, AlSiO, HfSiO and ZrSiO etc.

The buffer layer of silicon dioxide can be formed by wet conversion from the nitride by a wet furnace oxidation process. Other embodiments may be implemented using high temperature oxide (HTO) or LPCVD $SiO_2$. An aluminum oxide capping dielectric layer can be made by atomic vapor deposition, with a post rapid thermal anneal at about 900° for 60 seconds to strengthen the film.

Using these processes, a layer of silicon oxide can be formed with very few defects, and a capping layer of high-κ, high conduction band offset material like aluminum oxide, combine to provide a blocking dielectric layer which provides excellent retention characteristics and very low erase saturation voltages. Therefore, the EOT can be reduced and the operation voltage can be lowered.

In a representative embodiment, the first layer 13 can be 13 Å of silicon dioxide; the band offset layer 14 can be 20 Å of silicon nitride; the isolation layer 15 can be 25 Å of silicon dioxide; the charge trapping layer 16 can be 70 Å of silicon nitride; and the blocking dielectric layer 17A,17B can be of silicon oxide between 5 Å and 90 Å, with a capping layer of aluminum oxide between 5 and 90 Å The gate material can be p+ polysilicon (work function about 5.1 eV). For improved retention characteristics, it is preferred that the layer of silicon oxide have a thickness greater than 30 Å.

Also, it is found that the ratio of the thickness of the top layer 17B to the thickness of the bottom layer 17A of the blocking dielectric layer can be less than 2 for the combination of silicon oxide ($κ_1$=3.9) and aluminum oxide ($κ_2$=about 8). In general, the top layer 17B can have a thickness that is less that the ratio of the dielectric constants (8/3.9) times the thickness of the bottom layer 17A. Thus, the blocking dielectric layer as described herein includes a first layer 17A having a dielectric constant $κ_1$ contacting the charge trapping dielectric layer and a second layer 17B contacting another one of the channel surface and the gate, the second layer 17B having a dielectric constant $κ_2$ higher than $κ_1$ of the first layer, and the second layer having thickness less than $κ_2/κ_1$ times that of the first layer. For aluminum oxide as a top capping layer, the dielectric constant is ~8 and the barrier height or conduction band offset is more than 3 eV to obtain the erase saturation $V_{FB}$<−2V. Since the barrier height of $Al_2O_3$ is almost the same as $SiO_2$, the electron barrier height or conduction band offset of aluminum oxide with N+ polysilicon gate is about 3.1 eV.

In examples of memory cells described herein, in order to get a reasonable operation speed (program and erase) at a voltage of less than 20 volts, the total effective oxide thickness EOT for the multilayer dielectric stack (e.g., High-k-O—N—O—N—O, and High-k-O—N—O) between the gate and the channel should be less than 160 Å. The EOT of a bandgap engineered (BE) ONO tunneling barrier or a single layer $SiO_2$ tunnel oxide is typically in a range of about 40 to 55 Å, and preferably 45 to 50 Å and the EOT of a nitride charge trapping layer is typically in a range of about 25 to 40 Å, and preferably 30 to 35 Å. Therefore, the EOT for the multilayer blocking dielectric layer (e.g. $SiO_2$ buffer layer and $Al_2O_3$) is less than 95 Å, and preferably in a range of about 75 to 85 Å, for the memory cells described herein.

Figure 11:
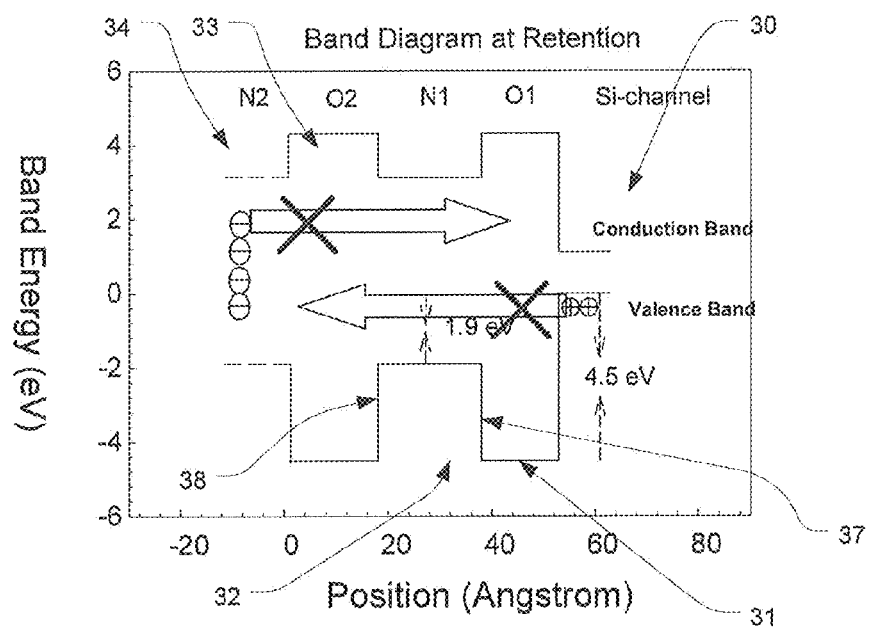
FIG. 11 is a band diagram for a tunneling dielectric layer including band offset technology at low electric fields.

FIG. 11 is a diagram of the energy levels of the conduction and valence bands of the dielectric tunneling structure including the stack of layers 13-15 of FIG. 10 under a low electric field, showing a "U-shaped" conduction band and an "inverted U-shaped" valence band. From the right side, the bandgap for the semiconductor body is shown in region 30, the valence and conduction bands for the hole tunneling layer are shown in region 31, the bandgap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer (region 34), and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling dielectric structure remains significantly below the valence band in the channel region 30. The tunneling layer described herein therefore is characterized by band offset characteristics, include a relatively large hole tunneling barrier height in a thin layer (region 31) at the interface with the semiconductor body, and an increase 37 in valence band energy level at a first location spaced less than 2nm from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

Figure 12:
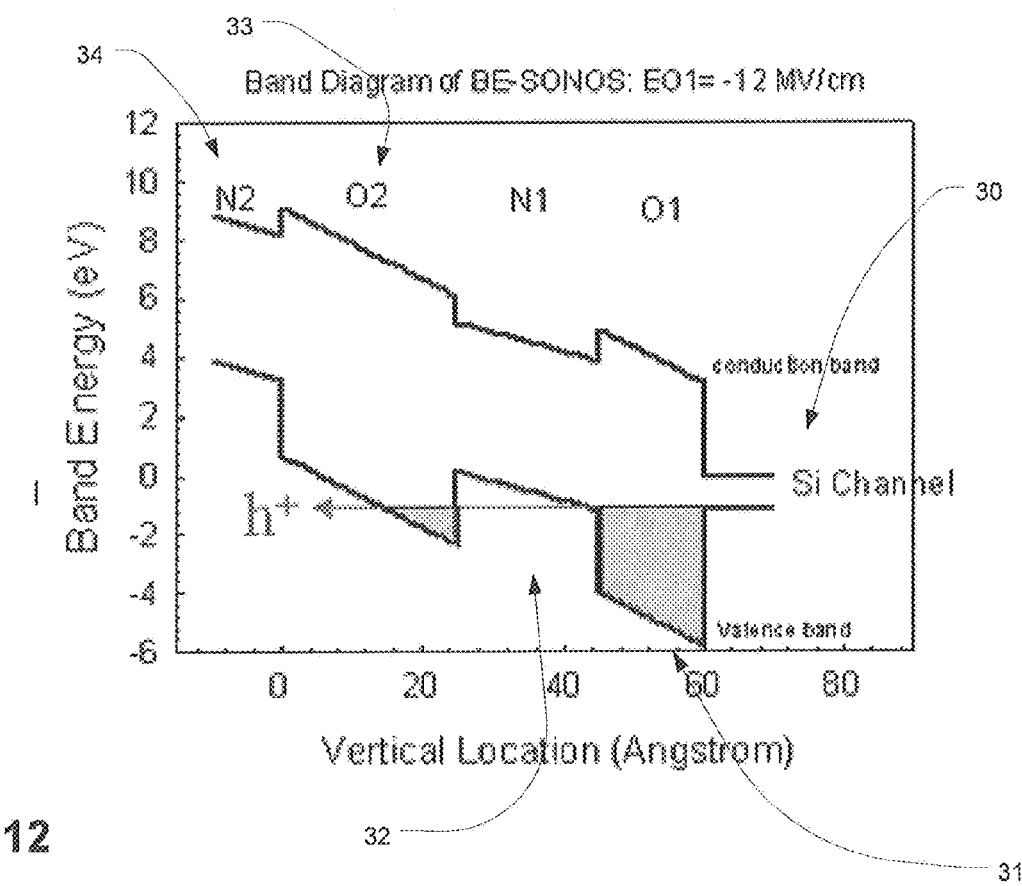
FIG. 12 is a band diagram for a tunneling dielectric layer including band offset technology at high electric fields.

FIG. 12 shows the band diagram for the dielectric tunneling structure under conditions of an electric field of about −12 MV/cm in the tunneling region 31, for the purposes of inducing hole tunneling (in FIG. 12, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 12) between the level of the valence band in the channel and above the sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer (region 33) isolates the offset layer 32 from a charge trapping layer (region 34). This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling region 31, for an embodiment employing silicon dioxide, should be less than 20 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using bandgap engineering.

In alternatives, the multilayer tunneling stack may be replaced with a single layer tunneling oxide as used in conventional MONOS devices, or with other tunneling layer structures. It is known that although the conventional MONOS (tunneling oxide>3 nm) has good data retention, its erase saturation level is too high for NAND application because the $SiO_2$ top oxide cannot well suppress the gate injection.

MANOS/TANOS were proposed as referred to above. These structures use an $Al_2O_3$ (k~8) to replace the top oxide (k=3.9). The erase saturation is greatly suppressed, therefore, MANOS device has lower erase saturation level and larger memory window than MONOS. However, the use of a single high-κ top dielectric may introduce new reliability issues. This is because the high-κ dielectric is often more leaky than the conventional $SiO_2$ top oxide. Therefore, the use of a single, high-κ top dielectric does not provide retention reliability.

As described herein, an additional high-κ capping film is capped on the top oxide of MONOS. This new structure has good retention and read disturbance characteristics because the buffer layer has a low leakage current and can form the deep traps in the interface between trapping layer (SiN) and buffer layer ($SiO_2$). Also, the top high-κ film can suppress the gate injection because of its high dielectric constant, so that this new innovation can get a low erase saturation level and large memory window, which are good for NAND flash applications.

Figure 13:
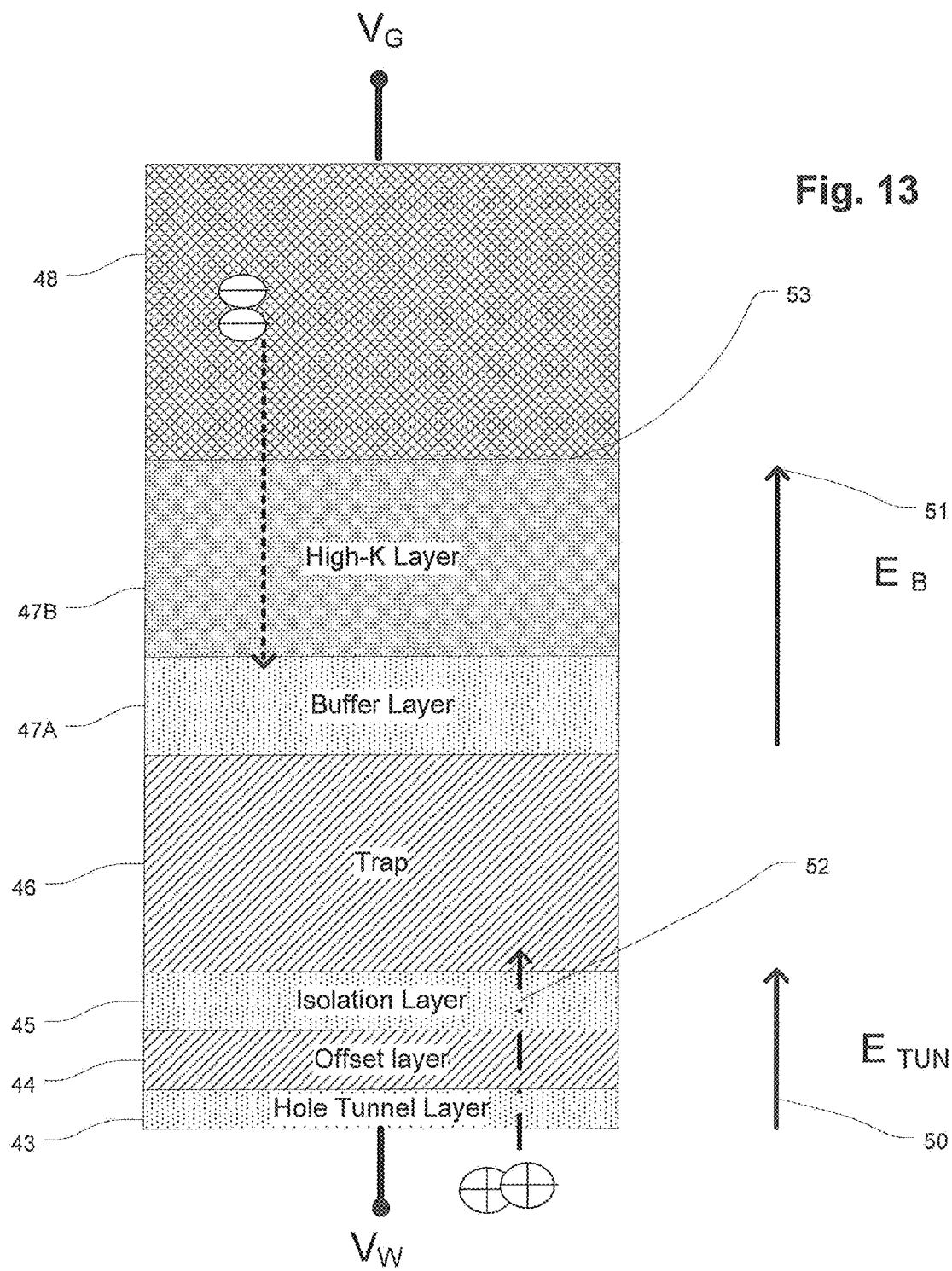
FIG. 13 illustrates the electric fields and tunneling currents during an erase operation for an embodiment of a memory cell.

FIG. 13 is a schematic illustration of the gate stack for a charge trapping memory cell like that in FIG. 10, showing electric field dynamics during an erase process. The gate stack includes a hole tunneling layer 43, a band offset layer 44, and an isolation layer 45 which in combination act as the dielectric tunneling layer for the device. A charge trapping layer 46 is shown on the tunneling dielectric layer. A blocking dielectric layer consisting of a multilayer structure including a buffer layer 47A and a capping layer 47B separates the charge trapping layer 46 from the gate 48. During an erase process, the electric field is induced by bias voltages $V_G$ and $V_W$ applied at the gate and channel of the memory cell, and results in an electric field $E_{TUN}$ 50 through the dielectric tunneling layer 43, 44, 45 and an electric field $E_B$ 51 through the blocking layer 47A/47B. The magnitude of the electric field $E_{TUN}$ 50 through the dielectric tunneling layer is sufficient to induce hole tunneling current 52 into the trapping layer 46. The magnitude of the electric field $E_B$ 51 through the capping layer 47B in the blocking dielectric layer is reduced relative to that through the silicon dioxide in the tunneling dielectric layer because of the higher dielectric constant by an amount that is about 3.9/κ, where 3.9 is the dielectric constant for silicon dioxide and κ is the dielectric constant of the capping layer 47B. Therefore, because of sufficient electron affinity of the gate 48, the relatively lower electric field $E_B$ 51 and the thickness of the blocking dielectric layer 47A/47B, electron tunneling current 53 is effectively blocked, allowing large memory windows without erase saturation effects. Memory devices as taught herein are operable with bias voltages across the gate and semiconductor body low enough that a maximum electric field of 14 MV/cm or less occurs in the tunneling dielectric layer during erase, with a corresponding lower electric field in the blocking dielectric layer.

Figure 14A:
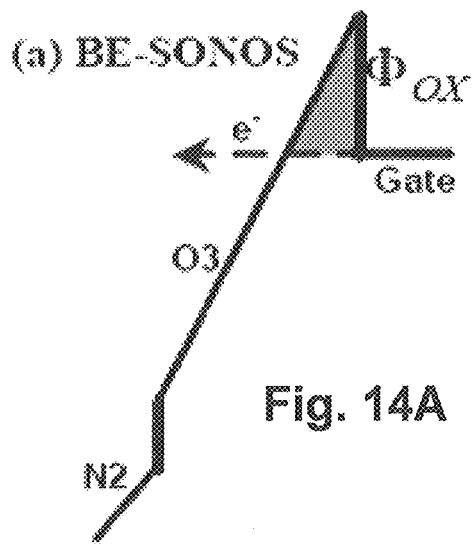
FIGS. 14A through 14D are conduction band diagrams for the blocking dielectric layer of a single silicon dioxide layer (FIG. 14A), a single aluminum oxide layer (FIG. 14B), a first example stacked silicon dioxide/aluminum oxide layer (FIG. 14C), and a second example stacked silicon dioxide/aluminum oxide layer having a thicker aluminum oxide layer than the first example (FIG. 14D).
Figure 14B:
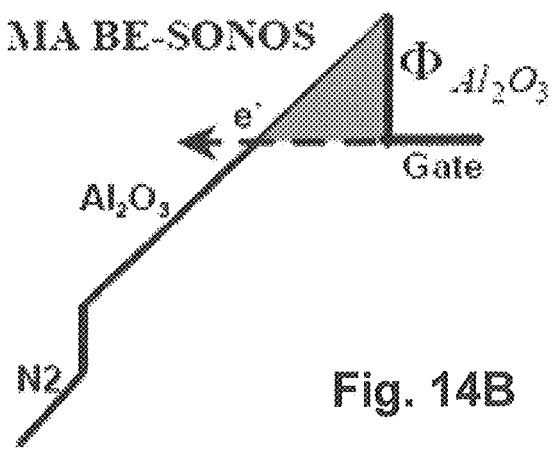
Figure 14C:
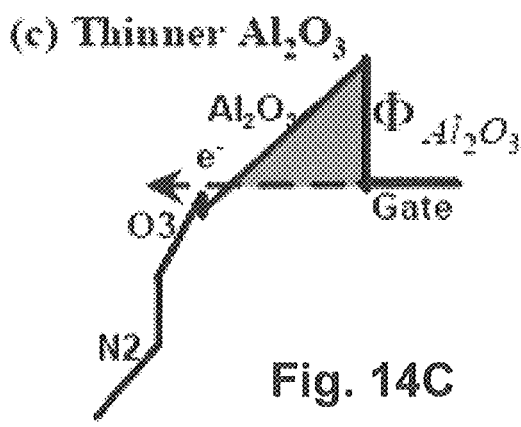
Figure 14D:
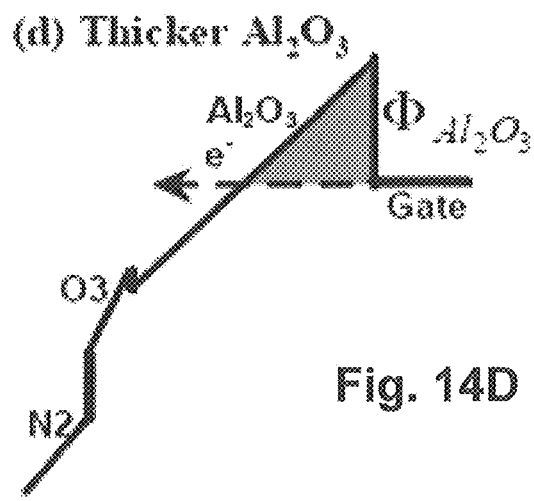

FIGS. 14A through 14D are conduction band diagrams for the blocking dielectric layer of a single silicon dioxide layer (FIG. 14A), a single aluminum oxide layer (FIG. 14B), a first example stacked silicon dioxide/aluminum oxide layer (FIG. 14C), and a second example stacked silicon dioxide/aluminum oxide layer having a thicker aluminum oxide layer than the first example (FIG. 14D). The tunneling probability for electron injection from the gate can be understood from these figures. The magnitude of the electric field within the material is reflected by the slope of the conduction band. Thus, the region corresponding to the silicon dioxide buffer layer labeled O3 in FIGS. 14C and 14D has a greater slope than the region corresponding to the aluminum oxide capping layer. The conduction band offset at the gate interface is reflected by the height of the step in the conduction band. For a bandgap engineered SONOS device as shown in FIG. 14A, the tunneling probability is relatively high, even though the conduction band offset is relatively large because of the high magnitude of the electric field. For an embodiment having an aluminum oxide blocking dielectric layer as represented in FIG. 14B, the tunneling probability is relatively low because of the lower slope on the conduction band caused by the relatively high dielectric constant (e.g. greater than 7), and because the conduction band offset remains relatively high (e.g. greater than 3 eV). FIGS. 14C and 14D suggest that the tunneling probability for gate injection is about the same for multilayer stacks having a silicon dioxide buffer layer and an aluminum oxide top layer, so long as the thickness of the aluminum oxide top layer is larger than a minimum value. Thus, the tunneling probability for the embodiment FIG. 14C having a thinner aluminum oxide layer is about the same as that for the embodiment of FIG. 14D having a thicker aluminum oxide layer.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit memory device, comprising:
   a semiconductor body;
   a plurality of charge storage structures arranged in series on the semiconductor body, the charge storage structures separated by insulating structures, the charge storage structures including dielectric charge trapping locations beneath a plurality of gates, the charge storage structures including a tunnel dielectric structure disposed above the semiconductor body, a charge storage layer disposed above the tunnel dielectric structure, and an insulating layer disposed above the charge storage layer; and
   the plurality of gates with an aspect ratio greater than 3, the aspect ratio being equal to a ratio of a height of the plurality of gates to a channel width between neighboring gates of the plurality of gates, the plurality of gates arranged in series controlling the charge storage structures beneath the gates; and
   the insulating structures having a relative dielectric constant with respect to vacuum that is less than a relative dielectric constant of silicon oxide.

2. The integrated circuit memory device of claim 1, wherein the gates are positioned sufficiently close together, such that in response to one or more of the gates having a pass gate voltage, the gates having the pass gate voltage have fringing electric fields that occupy most of at least one of the insulating structures that separate neighboring charge storage structures from the charge storage structures beneath the gates with the pass gate voltage, wherein the fringing electric fields are suppressed, by the insulating structures occupied by the fringing electric fields, from entering the neighboring charge storage structures.

3. The integrated circuit memory device of claim 1,
   wherein the insulating structures between neighboring charge storage structures of the plurality of charge storage structures, are air, and lack wing spacers.

4. The integrated circuit memory device of claim 1,
   wherein the gates are positioned sufficiently close together, such that in response to one or more of the gates having a pass gate voltage, the gates having the pass gate voltage have fringing electric fields that occupy most of at least one of the insulating structures that separate neighboring charge storage structures from the charge storage structures beneath the gates with the pass gate voltage, wherein the fringing electric fields are suppressed, by the insulating structures occupied by the fringing electric fields, from entering the neighboring charge storage structures, and
   wherein the full pitch of the charge storage structures, causes the fringing electric fields to occupy most of at least one of the insulating structures that separate neighboring charge storage structures from the charge storage structures beneath the gates with the pass gate voltage.

5. The integrated circuit memory device of claim 1,
   wherein the gates are positioned sufficiently close together, such that in response to one or more of the gates having a pass gate voltage, the gates having the pass gate voltage have fringing electric fields that occupy most of at least one of the insulating structures that separate neighboring charge storage structures from the charge storage structures beneath the gates with the pass gate voltage, wherein the fringing electric fields are suppressed, by the insulating structures occupied by the fringing electric fields, from entering the neighboring charge storage structures, and
   wherein the insulating structures suppress the fringing electric fields from entering a channel region.

6. The integrated circuit memory device of claim 1, wherein in response to one or more of the gates having a programming gate voltage, fringing fields adjacent to the insulating layer of the charge storage structures beneath the gates having the programming gate voltage, are suppressed by the insulating structures that separate neighboring charge storage structures from the charge storage structures beneath the gates with the programming gate voltage.

7. The integrated circuit memory device of claim 1, wherein in response to one or more of the gates having a programming gate voltage, fringing fields adjacent to the tunnel dielectric structure of the charge storage structures beneath the gates having the programming gate voltage, are suppressed by the insulating structures that separate neighboring charge storage structures from the charge storage structures beneath the gates with the programming gate voltage.

8. The integrated circuit memory device of claim 1, wherein in response to one or more of the gates having a programming gate voltage, fringing fields adjacent to the tunnel dielectric structure of the charge storage structures beneath the gates having the programming gate voltage, are suppressed by the insulating structures that separate neighboring charge storage structures from the charge storage structures beneath the gates with the programming gate voltage, such that the tunnel dielectric structure has a lateral voltage variation from the fringing fields of no more than a volt between a center of the tunnel dielectric structure and an edge of the tunnel dielectric structure.

9. The integrated circuit memory device of claim 1, wherein the insulating structures have a relative dielectric constant with respect to vacuum that is less than relative dielectric constants of materials in the tunnel dielectric structure.

10. The integrated circuit memory device of claim 1, wherein the insulating structures are air.

11. The integrated circuit memory device of claim 1, wherein the insulating structures are any of fluorinated silica glass, carbon doped silicon oxide, and spin-on polymer dielectric.

12. The integrated circuit memory device of claim 1, further comprising:
    a polymer thin film capping the insulating structures and the plurality of gates, wherein the insulating structures are air.

13. The integrated circuit memory device of claim 1, further comprising:
    a plurality of mushroom-shaped dielectric structures capping the insulating structures and the plurality of gates, wherein the insulating structures are air.

14. The integrated circuit memory device of claim 1, further comprising:
    a controller which applies a plurality of gate voltage settings to the plurality of gates.

15. The integrated circuit memory device of claim 1, wherein the tunnel dielectric structure disposed above the semiconductor body comprises a first silicon oxide layer adjacent a channel of the semiconductor body and having a thickness of 18 Å or less, a silicon nitride layer on the first silicon oxide layer having a thickness of 30 Å or less, and a second silicon oxide layer on the silicon nitride layer having a thickness of 35Å or less; and the charge storage layer comprises silicon nitride having a thickness of 50 Å or more; and the insulating layer comprises a blocking dielectric layer of silicon oxide.

16. A method for forming an integrated circuit memory device, comprising:

forming a plurality of charge storage structures arranged in series on a semiconductor body, the charge storage structures including dielectric charge trapping locations, the charge storage structures including a tunnel dielectric structure disposed above the semiconductor body, a charge storage layer disposed above the tunnel dielectric structure, and an insulating layer disposed above the charge storage layer; and forming a plurality of gates arranged in series controlling the charge storage structures beneath the gates, the plurality of gates with an aspect ratio greater than 3, the aspect ratio being equal to a ratio of a height of the plurality of gates to a channel width between neighboring gates of the plurality of gates; and forming insulating structures separating the charge storage structures, the insulating structures having a relative dielectric constant with respect to vacuum that is less than a relative dielectric constant of silicon oxide.

17. The method of claim 16, wherein the gates are positioned sufficiently close together, such that in response to one or more of the gates having a pass gate voltage, the gates having the pass gate voltage have fringing electric fields that occupy most of at least one of the insulating structures that separate neighboring charge storage structures from the charge storage structures beneath the gates with the pass gate voltage, wherein the fringing electric fields are suppressed, by the insulating structures occupied by the fringing electric fields, from entering the neighboring charge storage structures.

18. The method of claim 16, wherein in response to one or more of the gates having a programming gate voltage, fringing fields adjacent to the tunnel dielectric structure of the charge storage structures beneath the gates having the programming gate voltage, are suppressed by the insulating structures that separate neighboring charge storage structures from the charge storage structures beneath the gates with the programming gate voltage.

19. A method of operating NAND nonvolatile charge trapping memory device, comprising:

suppressing fringing fields of a NAND nonvolatile charge trapping memory cell from interfering with a threshold voltage of neighboring NAND nonvolatile charge trapping memory cells in the NAND nonvolatile charge trapping memory device, with insulating structures separating the NAND nonvolatile charge trapping memory cells in the NAND nonvolatile charge trapping memory device, the insulating structures having a relative dielectric constant with respect to vacuum that is less than a relative dielectric constant of silicon oxide, the NAND nonvolatile charge trapping memory cell and the neighboring NAND nonvolatile charge trapping memory cells having gates with an aspect ratio greater than 3, the aspect ratio being equal to a ratio of a height of the gates to a channel width between neighboring gates.

20. An integrated circuit memory device, comprising:
a semiconductor body;
a plurality of charge storage structures arranged in series on the semiconductor body, the charge storage structures separated by insulating structures, the charge storage structures including dielectric charge trapping locations beneath a plurality of gates, the charge storage structures including a tunnel dielectric structure disposed above the semiconductor body, a charge storage layer disposed above the tunnel dielectric structure, and an insulating layer disposed above the charge storage layer; and the plurality of gates arranged in series controlling the charge storage structures beneath the gates; and the insulating structures having a relative dielectric constant with respect to vacuum that is less than a relative dielectric constant of silicon oxide; and a polymer thin film capping the insulating structures and the plurality of gates, wherein the insulating structures are air.

21. The integrated circuit memory device of claim 20, wherein the insulating structures are any of fluorinated silica glass, carbon doped silicon oxide, and spin-on polymer dielectric.

22. An integrated circuit device, comprising:
a plurality of cells arranged in series on a semiconductor body, the cells separated by insulating structures;
a plurality of controlling terminals arranged in series controlling the cells; and
the insulating structures having a relative dielectric constant with respect to vacuum that is less than a relative dielectric constant of silicon oxide; and
a polymer thin film capping the insulating structures and the plurality of gates, wherein the insulating structures are air.

23. The integrated circuit device of claim 22, wherein the insulating structures are any of fluorinated silica glass, carbon doped silicon oxide, and spin-on polymer dielectric.

24. An integrated circuit device, comprising:
a plurality of cells arranged in series on a semiconductor body, the cells separated by insulating structures;
a plurality of controlling terminals with an aspect ratio greater than 3, the aspect ratio being equal to a ratio of a height of the plurality of controlling terminals to a width between neighboring controlling terminals, the plurality of controlling terminals arranged in series controlling the cells; and
the insulating structures having a relative dielectric constant with respect to vacuum that is less than a relative dielectric constant of silicon oxide.

* * * * *